United States Patent
Horch

(10) Patent No.: US 7,256,430 B1
(45) Date of Patent: Aug. 14, 2007

(54) THYRISTOR SEMICONDUCTOR MEMORY DEVICE AND METHOD OF MANUFACTURE

(75) Inventor: Andrew E. Horch, Sunnyvale, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 0 days.

(21) Appl. No.: 11/303,228

(22) Filed: Dec. 15, 2005

Related U.S. Application Data

(62) Division of application No. 10/639,058, filed on Aug. 11, 2003, now Pat. No. 6,998,298.

(51) Int. Cl.
*H01L 29/74* (2006.01)
(52) U.S. Cl. .................................... 257/163
(58) Field of Classification Search ............... 257/167, 257/163, 107, 133, 113, 164
See application file for complete search history.

(56) References Cited

U.S. PATENT DOCUMENTS

| | | | |
|---|---|---|---|
| 6,229,161 B1 | 5/2001 | Nemati et al. | |
| 6,462,359 B1 | 10/2002 | Nemati et al. | |
| 6,888,176 B1 * | 5/2005 | Horch et al. | 257/107 |
| 7,075,122 B1 * | 7/2006 | Yang et al. | 257/163 |
| 2004/0041212 A1 | 3/2004 | Bhattacharyya | |

OTHER PUBLICATIONS

C.K. Chen; *SLOTFET Fabrication of Self-Aligned Sub-100/nm Fully-Depleted SOI CMOS*; 2000 IEEE International SOI Conference, pp. 82-83, Oct. 2000.
C.K. Chen; *Fabrication of Self-Aligned 90-nm Fully Depleted SOI CMOS SLOTFETs*; IEEE Electron Device Letters, vol. 22, No. 7, pp. 345-347, Jul. 2001.

* cited by examiner

*Primary Examiner*—Howard Weiss
*Assistant Examiner*—(Vikki) Hoa B. Trinh
(74) *Attorney, Agent, or Firm*—Fields IP, PS

(57) ABSTRACT

A thyristor memory device may comprise a capacitor electrode formed over a base region of the thyristor using a replacement gate process. During formation of the thyristor, a base-emitter boundary may be aligned relative to a shoulder of the capacitor electrode. In a particular embodiment, the replacement gate process may comprise defining a trench in a layer of dielectric over semiconductor material. Conductive material for the electrode may be formed over the dielectric and in the trench. It may further be patterned to form a shoulder for the electrode that extends over regions of the dielectric over a base region for the thyristor. The extent of the shoulder may be used to pattern the dielectric and/or to assist alignment of implants for the base and emitter regions of the thyristor.

11 Claims, 13 Drawing Sheets

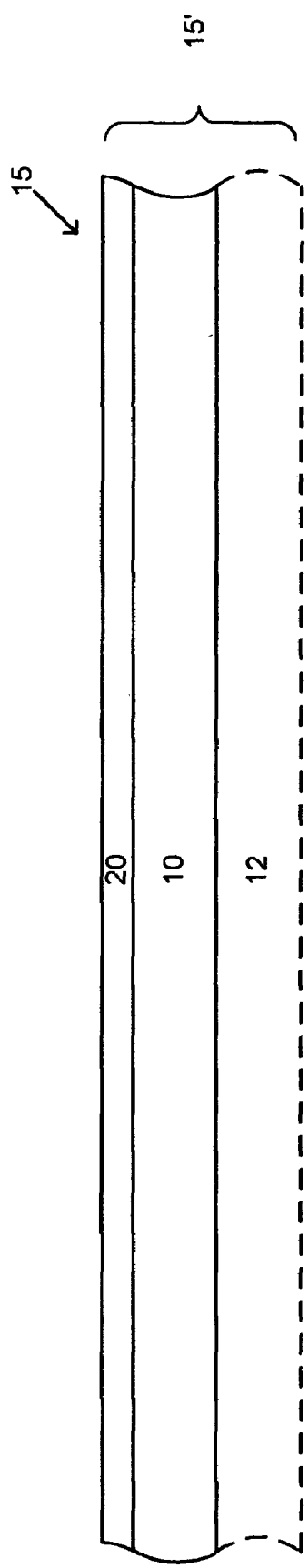
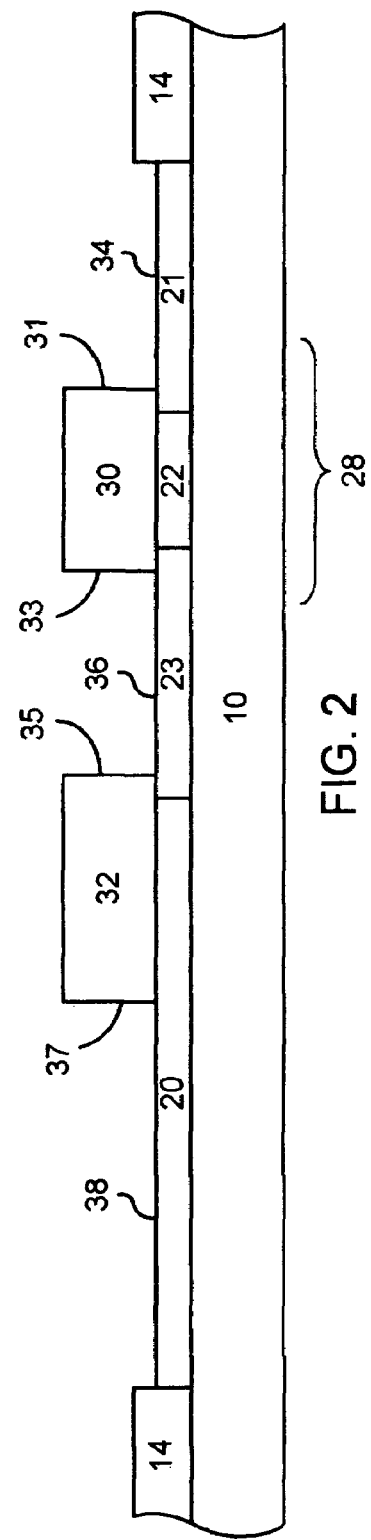
FIG. 1
FIG. 2

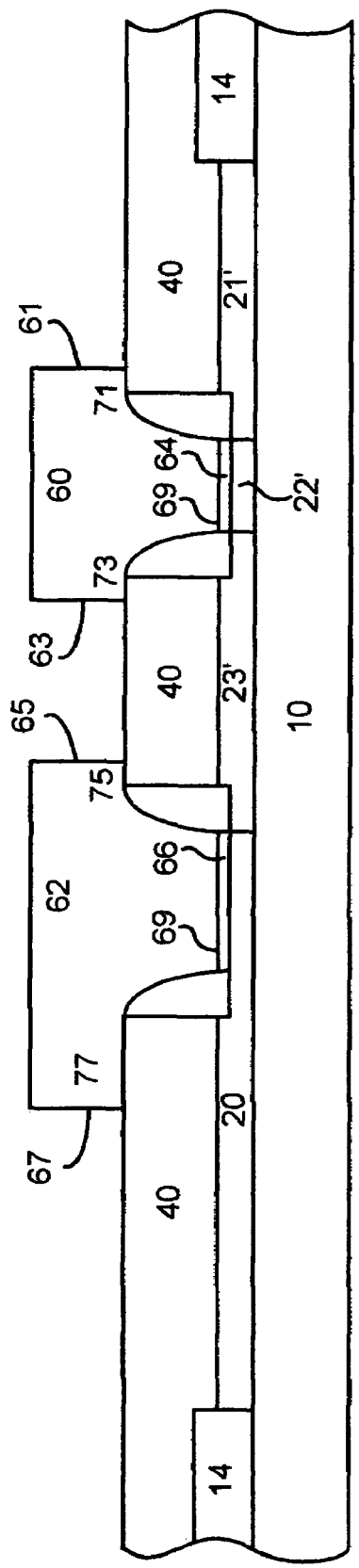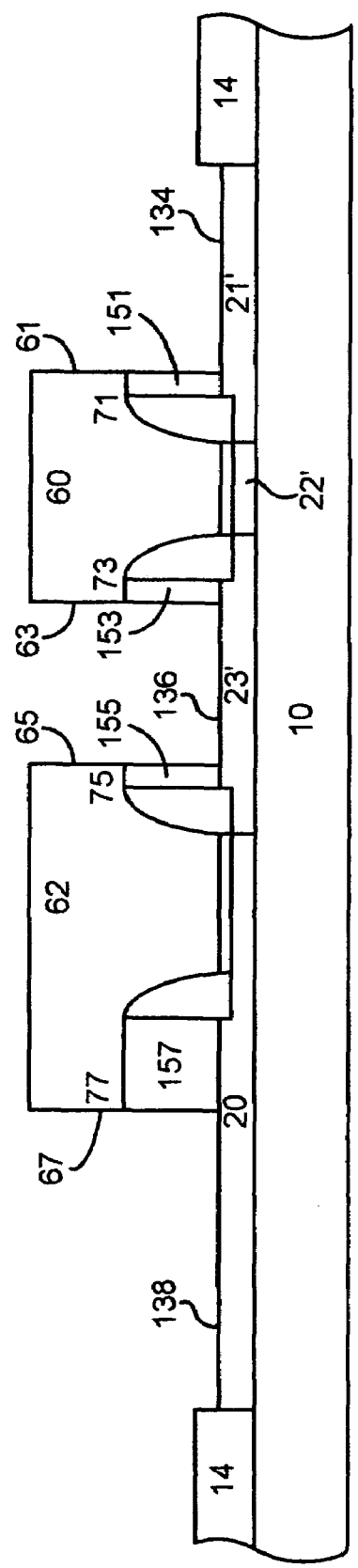

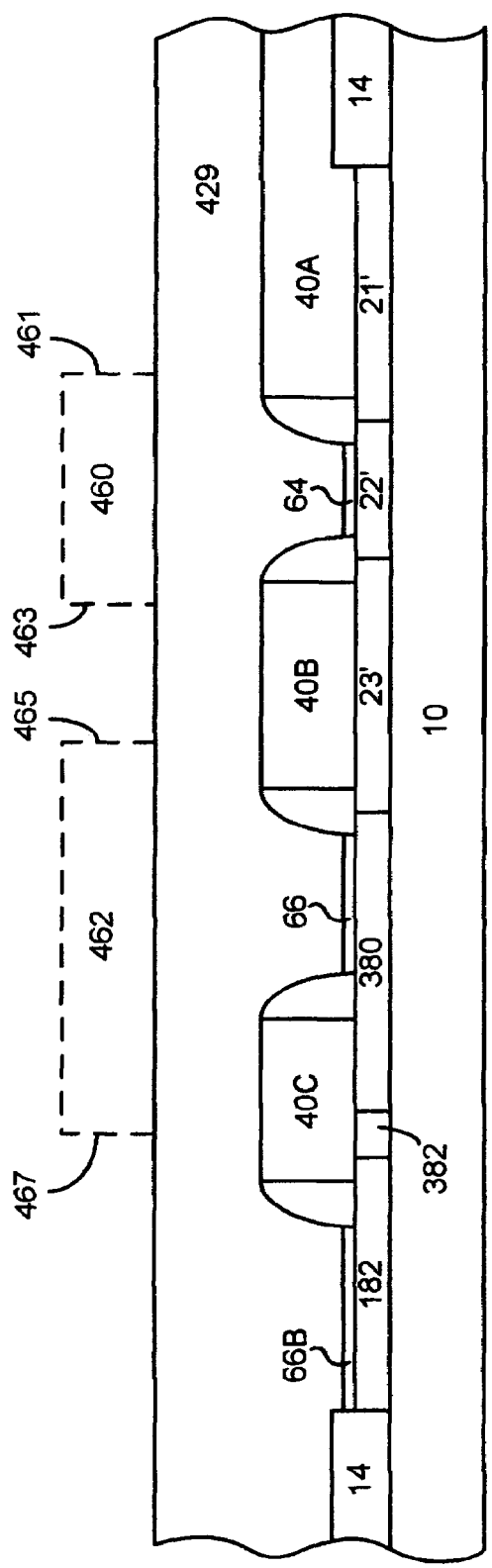
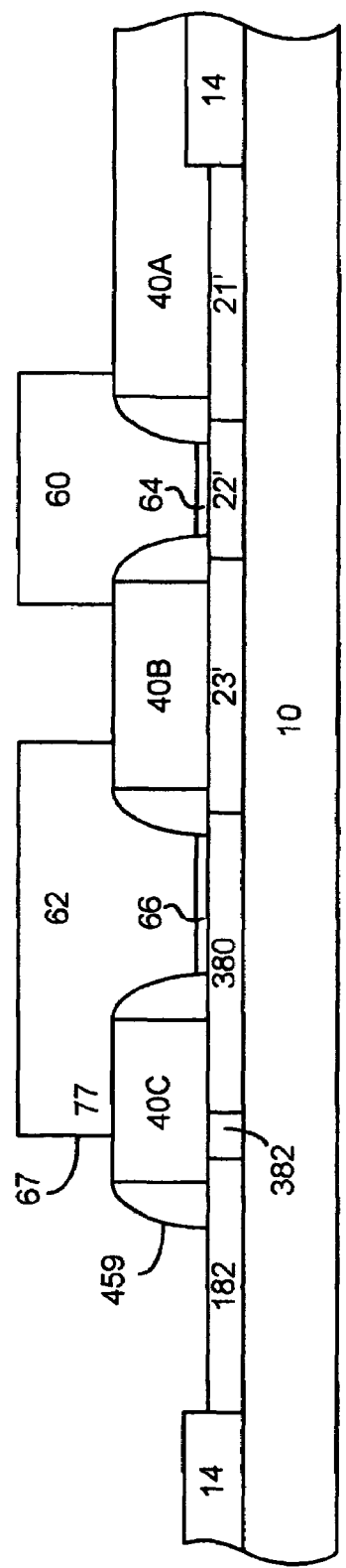
FIG. 15
FIG. 16

THYRISTOR SEMICONDUCTOR MEMORY DEVICE AND METHOD OF MANUFACTURE

RELATED APPLICATIONS

This is a divisional application of U.S. patent application Ser. No. 10/639,058, filed Aug. 11, 2003 now U.S. Pat. No. 6,998,298, entitled THYRISTOR SEMICONDUCTOR MEMORY DEVICE AND METHOD OF MANUFACTURE, which is incorporated herein by reference in its entirety.

BACKGROUND

The present disclosure is related to semiconductor devices and, more particularly, to thyristor semiconductor memory devices and their methods of manufacture.

Advancement of the semiconductor industry has brought about devices of decreased size and greater density for enabling higher levels of integration. Enabling some of these advancements, the silicon-on-insulator (SOI) technology provides for a layer of silicon over an insulator such as oxide. If the layer of silicon is made sufficiently thin, a voltage biased electrode thereover may be capable of fully depleting carriers within the silicon layer. Such structured devices may be described as fully depleting SOI devices and may be seen to enable further reductions in device geometries while at the same time enabling greater control of certain leakage characteristics.

In the case of a metal-oxide-semiconductor field-effect transistor (MOSFET), a gate electrode may be disposed in insulated, spaced relationship over a channel region within a layer of silicon. When biased, the gate electrode may produce an electric field in the channel to control conductivity thereof between the source and the drain regions of the MOSFET. For example, in an N type MOSFET, when charged positively, the gate electrode may attract negative carriers from within the channel toward a surface region thereof proximate and beneath the gate electrode. Assuming, in this example, that the channel may comprise P-type silicon disposed between N-doped source and drain regions, the positively charged gate electrode, thus, may be described as attracting "minority" carriers (electrons) from within the P-type channel toward the surface region just beneath the insulated gate electrode. Once a sufficient number of these carriers have been accumulated at the surface region beneath the insulated gate electrode, an "N-Channel" is formed therein and may be capable of passing charge between the source and the drain regions. For such device, reducing the thickness of the channel region may allow tighter coupling and responsiveness therefore to be established between the bias level of the gate electrode and the conductivity of the channel between the source and the drain regions. Additionally, a shorter length for the channel between the source and drain regions may allow charge to flow through the channel in less time, which in turn may permit faster operating speeds for the MOSFET.

Previously, the dimensions of these MOSFET devices have been limited by the minimum line widths by which gate electrodes could be formed over the channel regions. In the past, these minimum line widths had typically been limited by the resolution associated with photolithographic processes. More recently, however, MOSFET devices have been fabricated with use of replacement gate processes. Such replacement gate processes have enabled the formation of channels with lengths less than, e.g., 100 nm. The gate structures that may result from these replacement gate processes may be characterized as T-gates. As will be more fully disclosed herein, the T-gate may comprise a leg or foot portion thereof slotted between dielectric sidewalls. The dielectric sidewalls may comprise part of a trench that has been previously formed in the dielectric over the silicon layer. The foot may have a narrow width that is positioned over the channel region. Arms of the T-gate, however, may extend outwardly over the top to establish a broad width. This broad upper width may increase an overall cross-sectional area for the gate electrode to reduce its resistivity. Additionally, the top surface and sidewalls of the arms (or shoulders) associated with the T-gate may be treated with silicide to assist further reduction in resistivity of the gate electrode along its length.

In the case of fabricating a thin capacitively coupled thyristor (TCCT) device, a capacitor electrode may be formed over and capacitively coupled to a base region of the thyristor. The capacitor electrode may be driven as a wordline over the base region for capacitively coupling to the base to manipulate the voltage of the base region during certain electrical operations of the thyristor. For example, when trying to shutdown a current flow through the thyristor, it may be helpful to activate the capacitor electrode with a potential that may speed up the removal of minority carriers from within the base region. By such capacitor electrode or wordline activation, the operating state of the thyristor may transition more rapidly than what might otherwise be available by merely waiting for the decay/persistence/lifetime property of the minority carriers within the base region.

When fabricating TCCT devices, it may be necessary to form a second base region for the thyristor at a position that is offset from the capacitor electrode that is coupled to the first base region. The offset may allow activation of the capacitor electrode with reduced leakage (e.g., GIDL type) effects from the capacitor electrode upon the second base region. Typically, the fabrication techniques for the capacitor electrode for these TCCT devices have employed photolithographic procedures for forming (i) a rectangular cross-section for the capacitor electrode with a width thereof over the first base region, and (ii) forming the second base region offset from the gate electrode. Additionally, the silicide formations over the thyristor's emitter regions typically may use separate photolithographic and masking provisions for keeping the silicide separate and isolated from the first and second based regions. These types of fabrication procedures for the thin capacitively coupled thyristor (TCCT) devices could be viewed as consuming, utilizing and/or requiring large amounts of semiconductor real-estate across, e.g., an SOI substrate, which in turn would affect costs.

It may be noted, therefore, that the typical procedures for the formation of thin capacitively coupled thyristor devices, which have been formed differently relative to the procedures for SLOTFETs, might thus add to complexity, cost and size when integrated therewith in forming semiconductor devices such as thyristor memory and other embedded semiconductor systems.

SUMMARY

In accordance with an embodiment of the present invention, a memory device may comprise a thin capacitively coupled thyristor (TCCT) device integrated in series with an access transistor having a T-gate electrode. A T-structured capacitor electrode may be formed over and capacitively coupled to a first base region of the thyristor. During a method of fabrication, the capacitor electrode may be formed at the same time as the formation of the T-gate for the access transistor.

In another embodiment of the present invention, a method of fabricating a thyristor memory device may form a capacitor electrode capacitively coupled to and over a base region of the thyristor. The capacitor electrode may be formed using replacement gate procedures and in-situ with the formation of a T-gate to a MOSFET. In further embodiments, a boundary of the base and emitter regions for the thin capacitively coupled thyristor may be aligned relative to the lateral extent for a shoulder to the capacitor electrode.

In accordance with another embodiment of the present invention, a method of fabricating a thyristor memory may comprise forming a trench in a layer of dielectric disposed over a layer of semiconductor material for exposing a region of the semiconductor material through the opening defined by the trench. Conductive material may be formed over at least a portion of the dielectric and within the trench. The conductive material may then be patterned to define first and second shoulders thereof that may extend outwardly from the trench and on top of regions of the dielectric outside the trench. The patterning may form one of the shoulders with a length to overhang base regions for the thyristor within the layer of semiconductor material. Select regions of the layer of dielectric may then be etched while using the previously patterned conductive material with the first and second shoulders as an etch mask. The etched dielectric and previously patterned conductive material may then be used collectively as an implant mask to assist alignment of dopant during formation of base and emitter regions in the layer of semiconductor material.

In a further embodiment, the implanting of dopants may comprise forming a base region for the thyristor beneath the dielectric and also the overhang of the patterned conductive material. Additionally, a second implant may be performed using a substantially orthogonal angle of implant and dopant for defining an anode/cathode-emitter region that may also be aligned to the implant mask. In accordance with a further embodiment, at least one of the angles of implant and energies associated with the first and second implants may be altered so as to define a width for the base region. These parameters may also be controlled so as to form the base with an offset from the peripheral edge of the implant mask.

In accordance with a further embodiment, first sacrificial material may be patterned to cover portions of the layer of semiconductor material to be associated with a trench. Dielectric may then be formed over the semiconductor material and the patterned first sacrificial material. At least one of the dielectric and the first patterned sacrificial material may then be planarized to form substantially equivalent heights therefore. After the planarizing, the patterned first sacrificial material may be removed to expose sidewalls of the dielectric and define the trench at least in part by the exposed sidewalls of the dielectric. Additionally, portions of the semiconductor material that are exposed at the floor of the trench may then be etched to form a recess into the surface of the semiconductor material. After forming the trench, thermal oxide and poly material may be layered thereover for definition of the capacitor electrode in insulated relationship above a first base region for the thyristor. In a different embodiment, a high k dielectric and metal are used in place of thermal oxide and polysilicon respectively.

In a further embodiment, spacers may be formed against the sidewalls of the dielectric before the layering and patterning the conductive material within the trench. An access transistor may also be formed in the layer of semiconductor material and integrated in conductive relationship with an emitter to the thyristor. One of the source and drain regions to the access transistor may be formed in common with one of the emitter regions to the thyristor.

In accordance with another embodiment of the present invention, a method of fabricating a memory device comprises forming a first wordline over a silicon layer of an SOI substrate to provide a gate electrode to an access transistor. A second wordline may also be formed over the substrate for establishing a capacitor electrode to be capacitively coupled to a first base region of a thyristor. Regions of the substrate to be associated with the access transistor may be protected during implant of a first type conductivity dopant for forming a second base region to the thyristor. During the implant of the first conductivity type dopant, an acute angle of incidence may be used for forming the second base region to the thyristor beneath and aligned at least in part relative to a lateral extent for an edge of the second wordline. After the implanting to form the second base region, another implant of a second type conductivity dopant may be performed via a substantially orthogonal angle of incidence to form an emitter region of the thyristor that is aligned at least in part relative to the edge of the second wordline.

In a particular embodiment, the wordlines may be formed using replacement gate processes. For example, the formation of the wordlines may comprise forming first sacrificial dielectric over a substrate for establishing a pre-gate electrode and a pre-capacitor electrode. Source and drain regions may then be implanted about the pre-gate electrode for an access transistor while protecting regions proximate the pre-capacitor electrode. A second sacrificial dielectric may then be formed over the exposed surface areas of the substrate about and between the pre-gate and pre-capacitor electrodes. Planarization may be performed for exposing an upper surface of the first sacrificial dielectric of the pre-gate and pre-capacitor structures. After the planarization, the first sacrificial dielectric may be removed for exposing sidewalls of the second sacrificial dielectric that may define first and second windows. Spacers may be formed against the sidewalls of the second sacrificial dielectric for narrowing the first and second windows. The gate dielectric material can then be formed. Conductive material may be layered and patterned thereover with arms or gull-wings that extend over edges of the second sacrificial dielectric that define the openings. At least one of the shoulders to the capacitor electrode may extend over a portion of the second sacrificial dielectric with an extent sufficient to overhang a width of a second base region.

In a further embodiment, after forming base and emitter regions of the thyristor and the drain and source regions of an access transistor, the doped regions may be activated using a thermal anneal. Thereafter, exposed regions of silicon may be processed by a siliciding procedure which may employ a temperature less than the anneal associated with the dopant activations.

In yet a further embodiment of the present invention, a system may comprise a processor, memory and bus. The bus may transfer data between the processor and the memory. At least a portion of a memory may comprise a thin-capacitively coupled thyristor memory. A cathode/anode emitter, first base, second base and anode/cathode emitter region of the thyristor may be disposed in series relationship within the layer of silicon. Source/drain, channel and drain/source regions for an access transistor may also be disposed in electrical series relationship within the layer of silicon. One of the anode-emitter and cathode-emitter regions for the thyristor may be formed in common with one of the source and drain regions to the access transistor. A gate electrode may be disposed in insulated relationship over the channel region for the access transistor while a capacitor electrode may be disposed in insulated relationship over the first base region of the thyristor. The capacitor electrode may comprise a T-structure with its leg slotted within a trench defined by dielectric sidewalls and capacitively coupled to the first base region of the thyristor. One of the first and second arms to the T-structure of the capacitor electrode may extend laterally outward as an overhang over at least a portion of the first and second base regions.

Further, a silicide resistant dielectric may be disposed beneath the overhanging shoulder to the capacitor electrode and over corresponding portions of the first and second base regions. Silicide may be disposed over an anode/cathode-emitter region of the thyristor, and may meet an edge of the silicide resistant dielectric located beneath the overhanging shoulder of the capacitor electrode. The second base region may comprise a width at the surface of the layer of silicon that extends laterally beneath the silicide resistant dielectric.

BRIEF DESCRIPTION OF THE DRAWINGS

Subject matter of embodiments for the devices and methods of manufacture of the present invention may be understood by reading the following description with reference to the accompanying drawings, in which:

FIG. 1 is a cross-sectional view of a portion of a SOI substrate for processing by a method of fabrication for an embodiment of the present invention.

FIG. 2 is a cross-sectional view of a portion of a semiconductor device during a method of fabrication according to an embodiment of the present invention, showing separate pre-gate and pre-capacitor electrode structures, one over a channel to an access transistor and the other over a base region for a thyristor to be formed in the layer of silicon of the SOI structure.

FIG. 6 is a cross-sectional view of the portion of the semiconductor device of FIG. 5A in another stage of processing and useful to further describe a method of forming a semiconductor device in accordance with an embodiment of the present invention, and showing a gate to be associated with a MOSFET and a capacitor electrode to be associated with a thyristor.

FIG. 7 is a cross-sectional view of a portion of the semiconductor device of FIGS. 2–6 in another stage of fabrication useful to further describe a method of forming a thyristor memory, which includes patterning sacrificial material and defining a remaining portion thereof beneath a shoulder of a capacitor electrode.

FIG. 15 is a cross-sectional view of a portion of a semiconductor device in another stage of fabrication useful for describing fabrication of a thyristor memory in accordance with an embodiment of the present invention, and showing conductive material over trench and patterned dielectric and also showing photoresist thereover.

FIG. 16 is a cross-sectional view of a portion of a semiconductor device of FIGS. 2–3 and 13–15, in another stage of fabrication useful to describe a method of forming a thyristor memory, and showing a gate electrode associated with an access transistor and a capacitor electrode associated with a thyristor.

DETAILED DESCRIPTION

Figure 3:
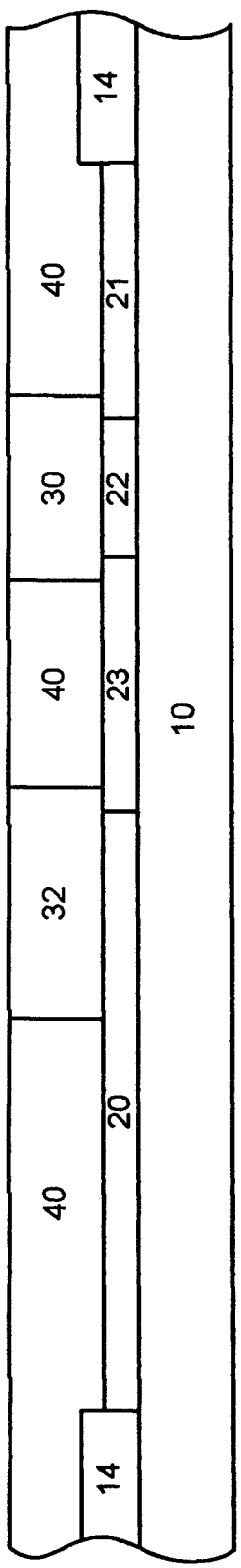
FIG. 3 is a cross-sectional view of a portion of the semiconductor device of FIG. 2 in another stage of processing and useful to further describe a method of forming the semiconductor device in accordance with an embodiment of the present invention and showing additional sacrificial material about the pre-gate and pre-capacitor structures over the SOI substrate.

In the description that follows, numerous specific details may be set forth to provide an understanding of exemplary embodiments of the present invention. It will be understood, however, that alternative embodiments may comprise sub-combinations of the disclosed examples.

Additionally, readily established circuits and procedures of the exemplary embodiments may be disclosed in simplified form (e.g., simplified block diagrams and/or simplified description) to avoid obscuring an understanding of the embodiments with excess detail. Likewise, to aid a clear and precise disclosure, description of known processes—e.g., formation of sidewall spacers, photoresist and mask patterning, etc.—may similarly be simplified where persons of ordinary skill in this art can readily understand their structure and formation by way of the drawings and present disclosure. For similar reasons, identical components may be given the same reference numerals, regardless of whether they are shown in different embodiments of the invention.

As used herein, "substrate" or substrate assembly may be meant to include, e.g., a portion of a semiconductor wafer. Such portion may have one or more layers of material including, but not limited to, Si, Ge, SiGe and all other materials that may have been previously formed on or within the substrate. Layered semiconductor materials may comprise, e.g., the same or different semi-conducting material such as Si/Si, Si/SiGe and silicon-on-insulator (SOI) may also be included herein. These layers and/or additional layers may be patterned and/or may comprise dopants to produce devices (e.g., transistors, diodes, thyristors, resistors, capacitors, interconnects, insulators, etc.) for an integration of circuitry. In forming these devices, one or more of the layers may comprise topographies of various heights. When referencing this integration of circuitry, therefore, it may be described as integrated together, on or with the substrate.

Furthermore, those skilled in the art will recognize that although embodiments of the present invention may describe fabrication of an N-type MOS transistor, the dopant type(s) of the substrate in addition to the doped regions thereof may be reversed to form a P-type MOS device. Likewise, certain embodiments may comprise both N-type and P-type devices on the same substrate as part of a combined CMOS process.

When forming a thyristor, it may be described with a particular order of anode-emitter, N-base, P-base and cathode-emitter. The anode-emitter may be described as attached, e.g., to a reference voltage and perhaps the cathode-emitter in common with a source/drain region of an access transistor. It will be understood, however, that for other embodiments, they may comprise an alternative order of the thyristor or change of NMOSFET devices to PMOSFET. For such alternative embodiments, the cathode-emitter might thus be coupled to a reference voltage and the anode-emitter coupled to the access transistor.

As referenced herein, portions of the semiconductor devices (e.g., a transistor or thyristor) may be described as formed in, at or on a semiconductor substrate. Such alternative terms in/at/on may be used individually merely for purposes of convenience. In the context of forming semiconductor devices, such terms may collectively reference portions of a semiconductor element that may be within and/or on a starting material.

When describing embodiments herein, the gate electrode may be referenced as a first electrode or wordline and the capacitor electrode that is electrically coupled over the thyristor device may be referenced as a second wordline or second electrode. Although these adjectives "first" and "second" may qualify certain elements herein, they need not be representative of a particular sequence or priority of devices. Rather, these terms "first" and "second" may be employed merely for convenience as a means for distinguishing the separate provisions to which they may be associated.

Further, as used herein, a first base region of the thyristor may typically be representative of the base region of the thyristor disposed beneath and capacitively coupled to the capacitor electrode for the TCCT. In the disclosure of an embodiment herein, this first base region might also be described as a "P"-base. A second base of the thyristor device, disposed between the anode/cathode-emitter and first base, may be described as an "N"-base. This N-base region may be offset from the capacitor electrode of the TCCT so that it may avoid GIDL ("gate" "induced" "drain" "leakage") type leakage effects from the capacitor electrode. In alternative embodiments, the thyristor may be formed with the "N"-base region coupled to the gate electrode instead of the "P"-base region, and the "P"-base region may be offset from the capacitor electrode.

By embodiments of the present invention, the capacitor electrode for the TCCT device may be integrated together with those for a T-gate for a SLOTFET. Additionally, definition of the second base to the thyristor may be aligned with relationship to an edge of a structure for the capacitor electrode. The width of this second base region may be defined via a difference between implant angles and shadowing therefore with respect to the edge of the structure for the capacitor electrode.

Further, in accordance with certain principals of thyristor operation, embodiments of the present invention may control the parameters and dimension of the second base regions such that the principal operating characteristics of the thyristor may be established by the second base and may overcome manufacturing variations associated with the first base. The capacitor electrode may be formed in a trench and used to define certain parameters of the first base. But because of a relatively low doping concentration of the first region, even though it may have minor variations in width due to manufacturing variations (per definition of the trench); these may have little effect on an overall operating characteristic of the thyristor semiconductor device. The second base region may be formed more precisely via the edge alignment and differences in implant angles so at to overcome some of the photolithography patterning limitations for defining the trench widths. Thus, when fabricating the thyristor device, certain manufacturing variations may be tolerated in the first base where the second base may be substantially controlling of the device operation.

As used herein, bipolar terminology may reference emitter and base elements of the thyristor. The distance of a base region that may extend between an emitter and a second base region may be described using a "width" descriptor. In a MOSFET, a "length" descriptor may reference the lateral extent for a channel region between separate source and drain regions.

When forming the doped regions and junctions of the MOSFET and thyristor devices, the implants may require an anneal to activate the dopants within the silicon material and to restore the lattice structures of silicon following the implants. With certain replacement gate process embodiments, the high temperature anneals may be performed before layering of the gate material. Accordingly, new material may be available for use in forming the gate electrode. For example, normally, the fabrication of a FET may use polysilicon for the material of the gate electrode. The polysilicon will withstand high temperatures associated with treatment or activation of the silicon and source/drain implants. When substituting tungsten for the gate, the tungsten may not be able to tolerate the higher temperatures associated with the source/drain activations. But, by employing the replacement gate processes of certain embodiments herein, materials of low thermal budget may be used for fabrication of the capacitor electrode of a thin capacitively coupled thyristor device. For the embodiments using low thermal budget materials for the gate and capacitor electrodes, their process sequence may allow dopant anneals for logic devices before the electrode or gate replacements.

In a method of fabricating a thyristor semiconductor memory device, in accordance with an embodiment of the present invention, referencing FIGS. 1–12, a starting substrate 15 as shown in FIG. 1 may comprise a layer of semiconductor material 20 disposed over insulating layer 10. An optional supporting member or structure 12 may be disposed beneath the insulating layer for an overall substrate 15'. In a particular embodiment, semiconductor layer 20 may comprise silicon and insulating layer 10 may comprise oxide as part of a silicon-on-insulator (SOI) substrate. In such example, oxide 10 may be referenced a buried oxide (BOX) and may comprise a thickness of about 3,000 angstroms. The layer of silicon may comprise a thickness, for example, less than 100 nanometers.

Having described one set of exemplary dimensions for the SOI substrate, it will be understood that alternative embodiments may employ different starting dimensions for the silicon and buried oxide, and that and these alternatives would also be encompassed within the scope of the present invention. For example, such alternatives may comprise an 800-angstrom silicon layer when employing, for example, a 90 nanometer patterning technology. Or it may use a 500-angstrom silicon layer when employing a 65 nanometer patterning technology. Furthermore, as will be more apparent in the disclosure subsequently herein, if using a thick layer of silicon, recesses may be formed therein to thin channel regions beneath a gate electrode or to thin material of the base region to be disposed beneath a capacitor electrode.

Referencing FIG. 2, isolation trenches 14 may isolate different active regions across the SOI substrate. In this example, one active region is shown for an access transistor and a thyristor device to be integrated therein. In alternative embodiments, the active regions might encompass other pluralities of semiconductor devices. In a particular embodiment, isolation trenches 14 may be filled with oxide. However, it would be understood that the isolation trenches could alternatively comprise dielectric other than oxide and might likewise be capable of withstanding the processing temperatures of silicon and be resistant to silicide formation.

Further referencing FIG. 2, first sacrificial material may be layered over the layer of silicon of the SOI substrate. In a particular embodiment, the first sacrificial material may comprise a dielectric such as nitride. The nitride may then be patterned using known photolithographic techniques for defining pre-gate and pre-capacitor structures 30, 32 respectively over regions of the silicon where the first and second wordline structures may reside. The pre-gate and pre-capacitor structures may be referenced alternatively as sacrificial electrode structures or sacrificial wordline structures. The sacrificial structure 30 for the gate region may be patterned with first and second sidewalls 31, 33 for defining protected and exposed regions of silicon 20 and to be associated with boundaries between channel and source/drain regions of a MOSFET 28. Likewise, pre-capacitor electrode structure 32 may comprise sidewalls 35, 37 for defining exposed and protected regions 36, 38 to be associated with different portions of a thyristor. Subsequently, the pre-gate and pre-capacitor structures 30, 32 may be replaced.

After patterning the first sacrificial material to define the first and second sacrificial structures 30, 32, logic implants may be performed to define source and drain regions 21, 23, on opposite sides of pre-gate structure 30. During these logic implants, regions of the silicon layer 20 to be associated with the thyristor may be protected; using for example, patterned photoresist. Additionally, a halo, source/drain extension, lightly doped drain or other implant might also be performed for the logic devices. The halo, source/drain extension, lightly doped drain or other implants can be formed with high angle implants to place the implant under the sacrificial material 30, 32 in a controllable manner. After the logic implants for the source and drain regions 21, 23; an anneal may be used for activating these dopants within the silicon. In accordance with an alternative embodiment, the activation of the source and drain regions may be performed after implanting the base and emitter regions to the thyristor device.

Moving forward with reference to FIG. 3, in another stage of fabricating a semiconductor thyristor memory device, second sacrificial material may be layered over the structure of FIG. 2 and may cover exposed regions 34,36,38 of the silicon layer between and about the previously patterned pre-gate and pre-capacitor structures 30, 32. After layering the second sacrificial material, a planarization, such as a chemical mechanical planarization (CMP), may be performed for planarizing at least one of the first and second sacrificial materials. The planarization may establish substantially equal heights for the first sacrificial material 30, 32 relative to second sacrificial material 40. In a particular embodiment, the planarization is continued until exposing upper surface regions of the first sacrificial material 30, 32. The second sacrificial material may comprise a dielectric that is different from that of the first sacrificial material. For example, the second sacrificial material 40 may comprise oxide and the first sacrificial material may comprise nitride. The oxide may further comprise a material of a spin-on-glass technology, BPSG or TEOS.

Figure 4:
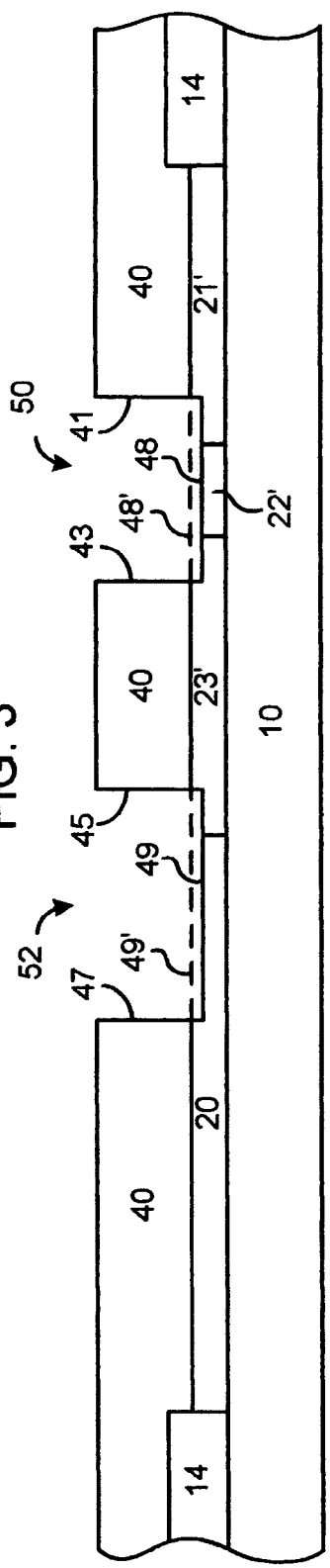
FIG. 4 is a cross-sectional view of a portion of the semiconductor device of FIG. 3 in another stage of processing and useful to further describe a method of forming the semiconductor device in accordance with an embodiment of the present invention and showing removal of the pre-gate and pre-capacitor structures, and also showing an optional recess in the silicon layer of the SOI substrate.

After the planarization procedure, moving forward with reference to FIG. 4, pre-gate and pre-capacitor structures 30, 32 may be removed by a selective etch process that may remove the first sacrificial material (e.g., nitride) more favorably than the second sacrificial material (e.g., oxide). Further, the etchant may also etch the nitride 30, 32 more favorably relative to silicon of layer 20. In such process, the etchant or etching procedure may continue until stopping at the stop layer or material of silicon.

Further referencing FIG. 4, after removing the first sacrificial material and exposing surface regions 48', 49' of the layer of silicon 20, an additional etch may be employed for lowering surface regions 48, 49 respectively of the silicon to define trenches via the openings defined by sidewalls 41, 43 for opening 50 and sidewalls 45, 47 for opening 52. In a particular embodiment of the present invention, the SOI substrate may begin with a layer of silicon of about, e.g., 100 nanometers thickness. The additional etch procedure may etch silicon more favorably relative to oxide 40 and may lower floors 48 and 49 for decreasing the silicon thickness at the recesses. In an alternative embodiment, for example, the layer of silicon may comprise a thickness of 50 nanometers, and the etching may remove approximately 20 nanometers of silicon. Again, it will be understood that these dimensions may be representative of merely particular exemplary embodiments and that alternative embodiments may use different dimensions for the silicon and trench recess.

Figure 5A:
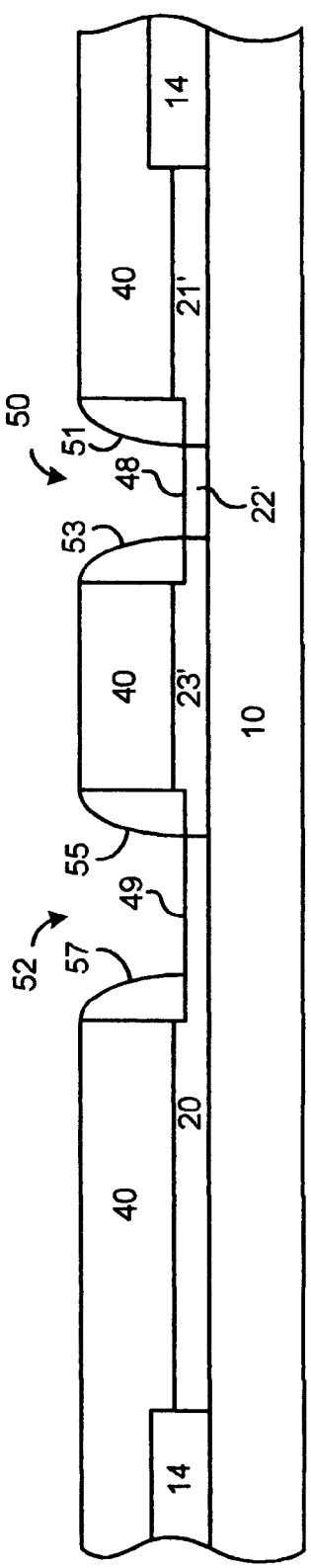
FIG. 5A is a cross-sectional view of a portion of a semiconductor device of FIG. 4 in another stage of fabrication and useful to further describe a method of forming a semiconductor device in accordance with an embodiment of the present invention, and showing spacers along sidewalls to the trench.

Referencing FIG. 5A, after forming trench openings 50, 52, dielectric may be layered conformal to the semiconductor structure, sidewalls 41,43,45,47 and floors 48, 49. In a particular embodiment, the conformal layer of dielectric may comprise nitride. Additionally, it may be formed with a thickness sufficient for reducing the width across opening 50 to that desired for a gate length for the SLOTFET. An anisotropic etch may then be performed (e.g., selectively for removing nitride more favorably relative to silicon) for defining spacers 51,53,55,57 against sidewalls 41, 43 of opening 50 and sidewalls 45, 47 of opening 52. The anisotropic etch may continue until exposing floors 48, 49 of the silicon surfaces between the sidewalls of the narrowed trenches.

Next, referencing FIGS. 5–6, dielectric may be formed over exposed regions of the silicon. For example, gate dielectric 64 (FIG. 6) may be formed over floor 48 within opening 50, and capacitor dielectric 66 may be formed over floor 49 of opening 52. In a particular embodiment, dielectric 64, 66 may comprise an oxide grown by a thermal "gate-ox" process. It will be understood that during such oxide formation, a portion of the silicon layer may be consumed as to further reduce its thickness.

Figure 5B:
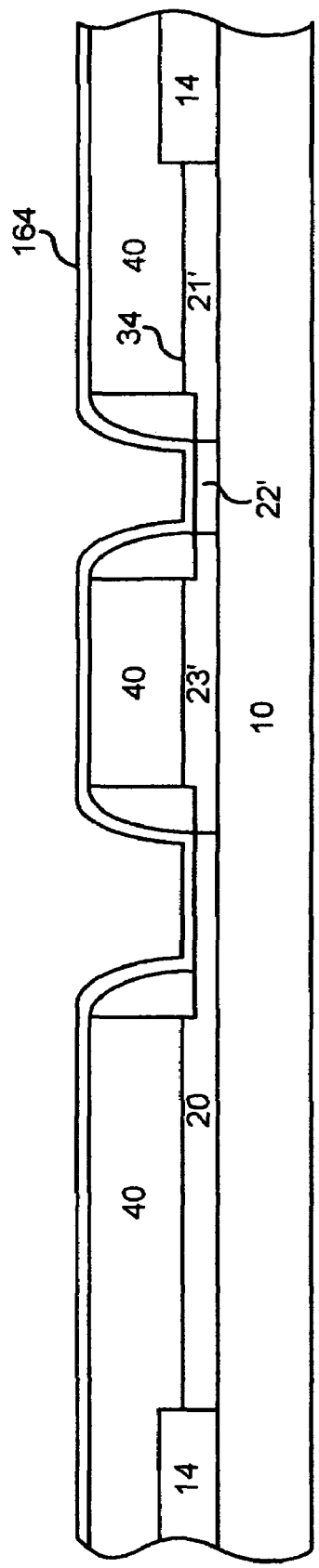
FIG. 5B is a cross-sectional view of a portion of a semi-conductor device of FIG. 5A in another stage of fabrication and useful to further describe a method of forming a semiconductor device in accordance with an embodiment of the present invention, and showing a conformal layer of dielectric.

In further embodiments, referencing FIG. 5B, after forming the spacers against the sidewalls of the second sacrificial dielectric and defining the openings (50, 52 of FIG. 5A), a thin layer of dielectric 164 may be formed. The dielectric may be deposited (e.g., by known chemical vapor deposition CVD procedure) to form a thin conformal layer—e.g., 20–100 angstroms—of the dielectric over exposed regions (49, 48 of FIG. 5A) of the layer of silicon and over spacers 51,53,55,57 and second sacrificial dielectric 40. The dielectric may comprise a high-k dielectric material as known in the art of semiconductor capacitor fabrication.

Figure 5C:
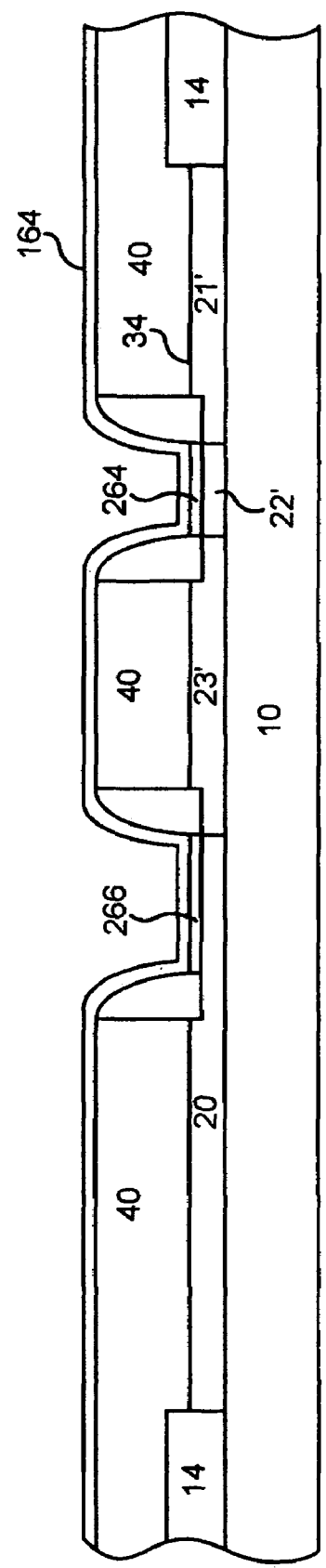
FIG. 5C is a cross-sectional view of a portion of a semi-conductor device of FIG. 5A in another stage of fabrication and useful to further describe a method of forming a semiconductor device in accordance with an embodiment of the present invention, and showing two layers of dielectric for a capacitor dielectric.

In another embodiment, referencing FIG. 5C, before layering the conformal layer of high-k dielectric, first dielectric 264, 266 may be formed over the exposed regions of silicon. The first dielectric may act as a barrier between materials of the high-k dielectric and the layer of silicon 20. In a particular embodiment, known thermal oxidation processes may be used to form the first dielectric.

In an area for a MOSFET, the dielectric may be referenced as a gate oxide/dielectric and may be used to space a gate electrode for the MOSFET over channel region 22' in the layer of silicon. In an area for a thyristor, the dielectric may be referenced as a capacitor dielectric and may serve to space a capacitor electrode over a first base region for the thyristor. When using the high-k dielectric material for the capacitor dielectric, first dielectric 266 beneath the high-k dielectric may be described as a pedestal or barrier layer.

In a further embodiment, after forming the conformal layer of high-k dielectric, an anneal may be performed to fill pinholes of the high-k dielectric and to improve an overall integrity of the gate and capacitor dielectrics.

In yet a further embodiment, after forming the thermal oxide over the exposed regions of the silicon layer, the high-k dielectric material may be deposited while protecting regions associated with the MOSFET. Accordingly, the high-k dielectric may be formed against the pedestal oxide for the capacitor dielectric; yet, the gate electrode may comprise simply the previously grown thermal oxide.

Further referencing FIG. 6, after lining the floor of the trenches with dielectric, e.g., thermal oxide 66,64 a conductive material, such as polysilicon, may be formed over the resultant structures and may fill the trenches between spacers 51, 53 and 55, 57. In a certain embodiment, the conductive material may be formed with a thickness greater than the depth of the trenches. Thereafter, the upper surface of the conductive material may be planarized and photolithographic patterned for defining a gate electrode 60 in opening 50 and a capacitor electrode 62 in opening 52.

Continuing with reference to FIG. 6, the patterning may form gate electrode 60 per a cross-section thereof with a body or leg slotted in the trench. A lower face 68 of the leg faces channel region 22' and may be insulated therefrom by gate oxide 64. The conductive material may be patterned, e.g., by an anisotropic etch while using the previously patterned photoresist as an etch mask. The etch may form sidewalls 61 and 63 to first and second shoulders 71 and 73 for the gate electrode, which may extend outwardly over spacers 51, 53 and over neighboring portions of the sacrificial material 40 about opening 50.

The capacitor electrode 62 may similarly be formed with a body portion slotted in opening 52 with its lower surface 69 facing silicon layer 20 and insulated therefrom by oxide 66. The anisotropic etching of the conductive material may form sidewalls 65 and 67 to define shoulders 75 and 77, of the capacitor electrode. Shoulders 75 and 77 may be formed in contiguous relationship with the body portion of the capacitor electrode, and may extend laterally outward from the trench and over spacers 55, 57 and over neighboring portions of the second sacrificial material 40 about opening 52. Second shoulder 77 of the capacitor electrode 62, the distant gate electrode 60, may comprise a length greater than that of its first shoulder 75 or it may also be greater than the length of shoulders 71, 72 of gate electrode 60.

In a further embodiment, second shoulder 77 may comprise a lateral edge 67 to define an overhang across the second sacrificial material 20 and over regions in the layer of the silicon 20 to be associated with the second base region of the thyristor. The lateral extent of this second shoulder 77 may allow an offset of the second base relative to the lower surface 69 for capacitor electrode 62.

In one embodiment, referencing FIGS. 6–7, after patterning the conductive material for defining shoulders 71, 73 to gate electrode 60 and shoulders 75, 77 to the capacitor electrode 62, an anisotropic etch may remove exposed regions of the second sacrificial material 40 while using the patterned gate and the capacitor electrodes as an etch mask. The anisotropic etching may continue until reaching or exposing surface regions 134,136,138 of the layer of silicon for the source/drain regions 21', 23' to the access transistor and exposing the surface of the second emitter region for the thyristor. The anisotropic etch may further define residual or remaining portions 151,153,155,157 of the second sacrificial material beneath respective shoulders 71,73 of the gate electrode 60 and shoulders 75,77 of the capacitor electrode 62.

Figure 8:
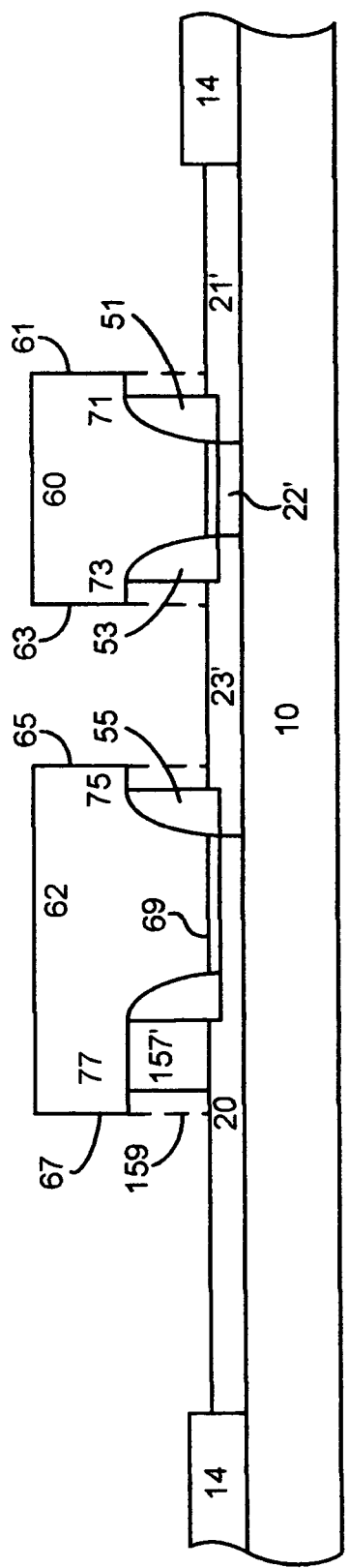
FIG. 8 is a cross-sectional view of a portion of the semiconductor device of FIGS. 2–7 in another stage of processing useful to further describe a method of forming a thyristor memory, and showing an optional removal of sacrificial material from beneath shoulders of a gate electrode.

Referencing FIGS. 7–8, in accordance with an optional provision of an embodiment of the present invention, remaining portions 151, 153 and 155 of the second sacrificial material beneath respective first and second shoulders 71, 73 of the gate electrode and first shoulder 75 of the capacitor electrode may be removed selectively using, for example, an isotropic etchant that etches oxide more favorably relative to silicon of silicon layer 20 and more favorably relative to nitride of spacers 51,53,55 and more favorably relative to conductive material of gate and capacitor electrodes 60, 62. The oxide removal by the isotropic etch may be performed for a duration sufficient for clearing the residual portions of the second sacrificial material beneath the overhangs of the first wordline for the access transistor and beneath the first shoulder of the second wordline of the capacitor electrode.

This isotropic etch may remove part of the second sacrificial material 157 located beneath the second shoulder 77 of the capacitor electrode 62. It may form peripheral edge 159 of the dielectric laterally recessed beneath the overhang of the second shoulder 77. The lateral extent of the second shoulder 77 and a duration of the etch may be controlled to leave a sufficient portion 157' of the second sacrificial material beneath the overhang so as to form the peripheral edge 159 with a sufficient lateral offset from lower surface 69 of the capacitor electrode such that a full width of a second base region may be formed beneath remaining dielectric 157'.

In accordance with a particular embodiment of the present invention, the lateral extent for the second shoulder 77 to capacitor electrode 62 may be defined with a length of about 70 to 150 nanometers. Additionally, the second sacrificial material may be formed with thickness of about 60 to 150 nanometers.

Figure 9:
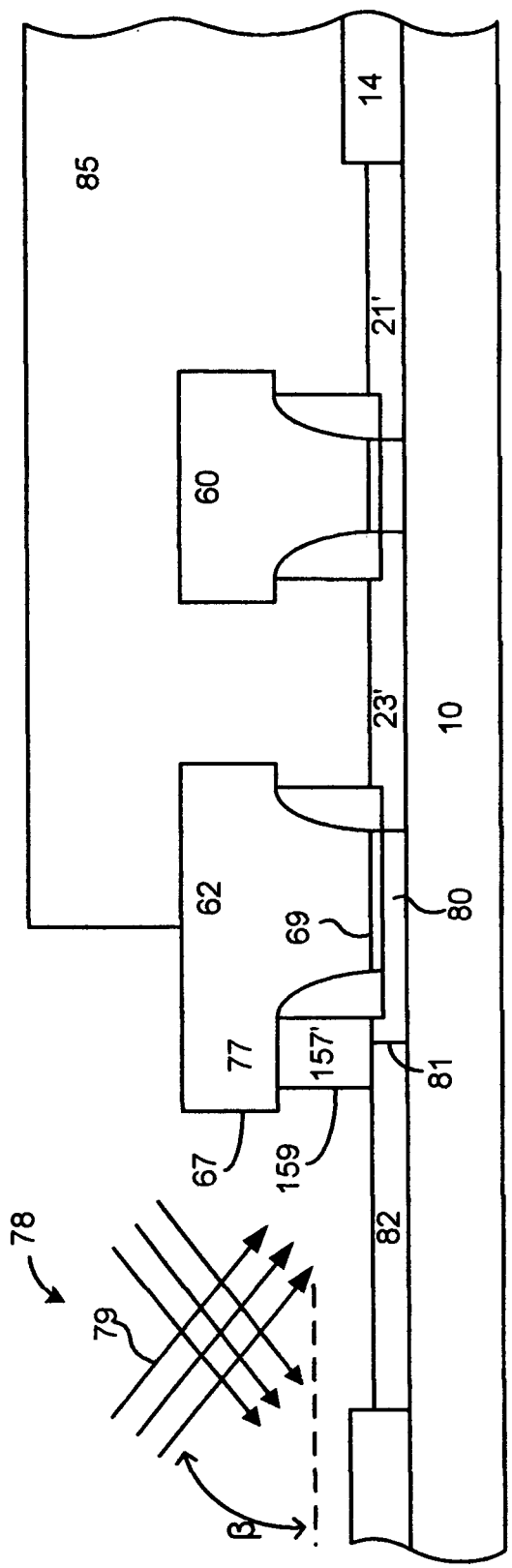
FIG. 9 is a cross-sectional view of a portion of the semiconductor device of FIGS. 2–8 in another stage of fabrication useful to further describe a method of forming a thyristor memory, and showing formation of a base region within a silicon layer that may be aligned relative to an edge of a remaining portion of dielectric that is beneath a capacitor of a capacitor electrode.

Moving forward with reference to FIG. 9, a dopant implant 78 may be performed using a first conductivity type dopant, e.g., an N-type dopant of phosphorus or arsenic. The implant 79 may use a direction of incidence 79 to define an acute angle β relative to a plane associated with an upper surface of the silicon layer. The angle of incidence β and energy of the implant may be controlled to extend the dopant of the implant and form interface 81 therefor relative to the first base region 80 at a location beneath the second shoulder for the capacitor electrode 62. In this embodiment, as shown in FIG. 9, the N-P interface 81 is formed at a position laterally clear from the lower surface 69 of capacitor electrode 62 and beneath the remaining portion 157' of the second sacrificial dielectric and also beneath the overhang shadow of second shoulder 77 of capacitor electrode 62. Accordingly, the N-P interface 81 may be described as being defined relative to a peripheral edge 67 of the capacitor electrode 62, and likewise relative to peripheral edge 159 of remaining portion 157' of the second sacrificial dielectric.

In a particular embodiment, this angled implant 78 for the N-base may using an implant species such as phosphorus, an implant angle of about 45 degrees, an implant dose of about $5 \times 10^{14}/cm^2$ and energy of about 70 keV. The selection of implant species, angle and energy in combination with the lateral extent of the implant mask 157' may be controlled to implant the N-base beneath shoulder 77 of the capacitor electrode 62 while remaining clear of the region beneath lower surface 69 of the capacitor electrode. Being offset from the lower surface 69 of the capacitor electrode, the first base region may avoid GIDL-type leakage effects during operation of the second wordline 62.

In accordance with an alternative embodiment of the present invention, the residual or remaining portions of the second sacrificial material (oxide) are not removed from beneath the gate electrode shoulders. And, for such alternative embodiment, the peripheral edge for the remaining portion of sacrificial material 157 beneath second shoulder 77 of capacitor electrode 62 may remain vertically aligned directly beneath sidewall 67 of the second shoulder to the capacitor electrode. Additionally, second shoulder 77 in combination with patterned dielectric 157 therebelow may be used together as an implant mask during formation of N-base 82.

Figure 10:
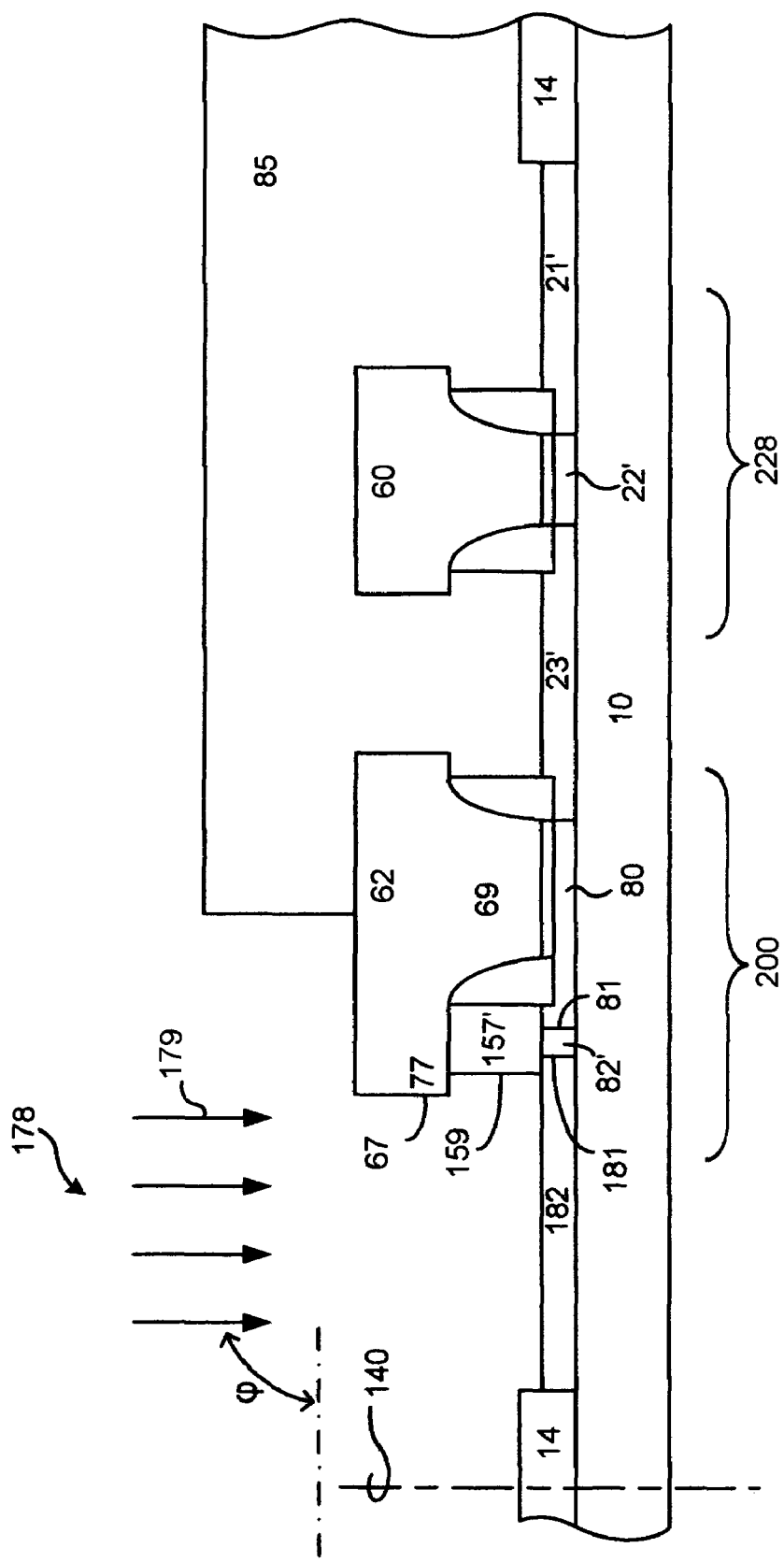
FIG. 10 is a cross-sectional view of a portion of a semiconductor device of FIGS. 2–9 in another stage of fabrication useful to further describe a method of forming a thyristor memory and showing an implant for defining an emitter region.

Referencing FIG. 10, after implanting the dopant for the second base region 82, the same implant mask 157', 77 may be used during implant 178 of opposite conductivity type impurities for definition of an anode/cathode-emitter region 182. Implant 178 may use a P-type species such as boron and a substantially orthogonal angle φ of incidence 179 relative to an upper plane defined by the upper surface of the silicon layer. In a particular embodiment, the implant may use an angle of incidence φ within about 5 degrees of the orthogonal angle, dosage of about $5 \times 10^{15}/cm^2$ and implant energy of about 7 keV.

This implant 178 for emitter region 182 may form N-P interface 181 relative to base region 82'. In this embodiment, the width of the second base region 82' is disposed beneath the remaining portion of second sacrificial material 157' and at a position clear of the lower surface 69 of capacitor electrode 62. It may also be positioned with a slight offset beneath edge 159 of the implant mask. In this embodiment, the difference between the implant angles β and φ of the base and emitter implants 78, 178 respectively, in combination with respective implant energies and species may establish the width of second base region 82' between the interfaces 81 and 181. During these base and emitter implants, a photoresist mask 85 may protect regions of the semiconductor substrate associated with access transistor 228. In this embodiment, photoresist 85 may also protect a partial region of capacitor electrode 62 proximate the access transistor 228.

Further referencing FIG. 10, in further embodiments, additional thyristor and transistor devices may be formed at the same time and as mirrored representations of thyristor 200 and access transistor 228 about a mirror axis 140.

Figure 11:
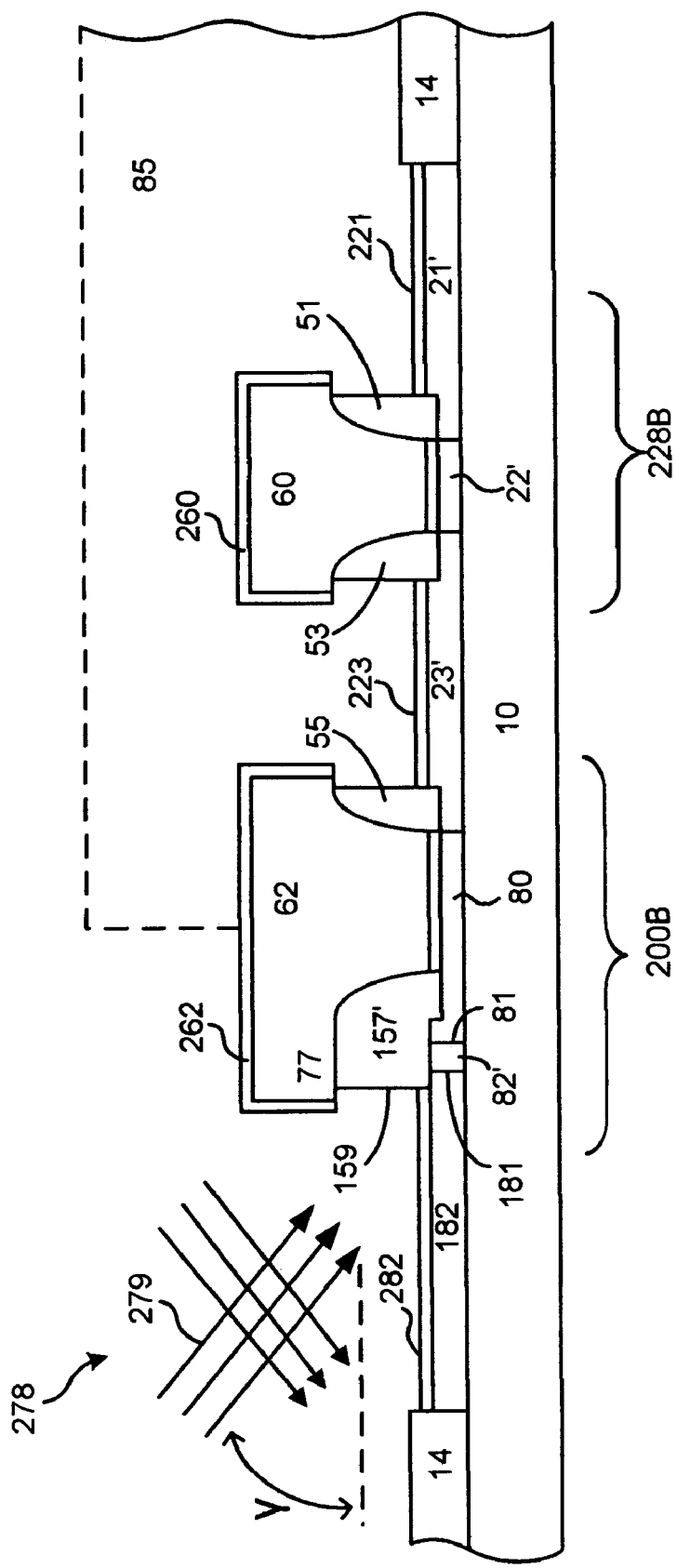
FIG. 11 is a cross-sectional view of a portion of a semiconductor device of FIGS. 2–10 in another stage of fabrication useful to describe a method of forming a thyristor memory in accordance with embodiments of the present invention, showing silicide on the emitter regions and on the surface regions of the gate and capacitor electrodes, and also showing an implant for a leakage adjustment species.

Referencing FIG. 11, after defining second base 82' and emitter 182, the dopant species from the various implants may be activated using an anneal process. In a further embodiment, an additional lifetime adjustment implant 278 may be formed in the emitter region 182. This implant might also be formed across interface 181 between emitter 182 and second base 82'. The impurity lifetime adjustment species may affect leakage properties, across the base emitter interface. In accordance with this optional embodiment, the implant species, energy level and angle of incidence may be selected such that the lifetime adjustment species may overlap the emitter and second base interface but not that between the first and second bases. Examples of lifetime adjustment species may include impurities such as germanium, carbon, metal, or inert gas of a damage implant type. Further information of such lifetime adjustment species may be found in U.S. Pat. No. 6,462,359 entitled "Stability in Thyristor-Based Memory Device" of Nemati, et al., hereby incorporated by reference in its entirety.

Referencing FIG. 11, photoresist 85 may then be removed and metal comprising at least one of the group consisting of cobalt, titanium, tungsten, platinum, nickel, or other metal may be formed over the substrate and wordlines. A heat process may then be performed using a temperature sufficient to cause the metal to react with the semiconductor material (such as silicon), but avoiding metal-dielectric diffusion. Accordingly, metal may diffuse into the exposed surface regions of the silicon self-aligned thereto at locations 282, 223, 221 as associated with emitter region 182, and the source and drain regions 23' and 21' respectively. Additionally, the metal may similarly treat exposed regions 260, 262 of gate electrode 60, and capacitor electrode 62 respectively. After this silicide formation, remaining metal may be removed using, for example, an acid bath for leaving silicide over the anode emitter region 182, which will be self-aligned relative to dielectric 157'. Additionally, salicide 223 (self-aligned silicide) is left over source/drain region 23' between spacers 53, 55 of the gate electrode 60 and capacitor electrode 62 respectively. Also, salicide 221 may be left over the exposed drain/source region 21' between isolation trench 14 and spacer 51 against the gate electrode 260. Accordingly, a thyristor memory cell 300 may be formed, comprising T-gate 60 for access transistor 228B and T-structure for capacitor electrode 62 for thyristor 200B and with salicide 260, 262 over the electrode surface regions. Additionally, cathode/anode-emitter region 23' for thyristor 200 may be formed in common with source/drain region 23' to access transistor 228.

Figure 12:
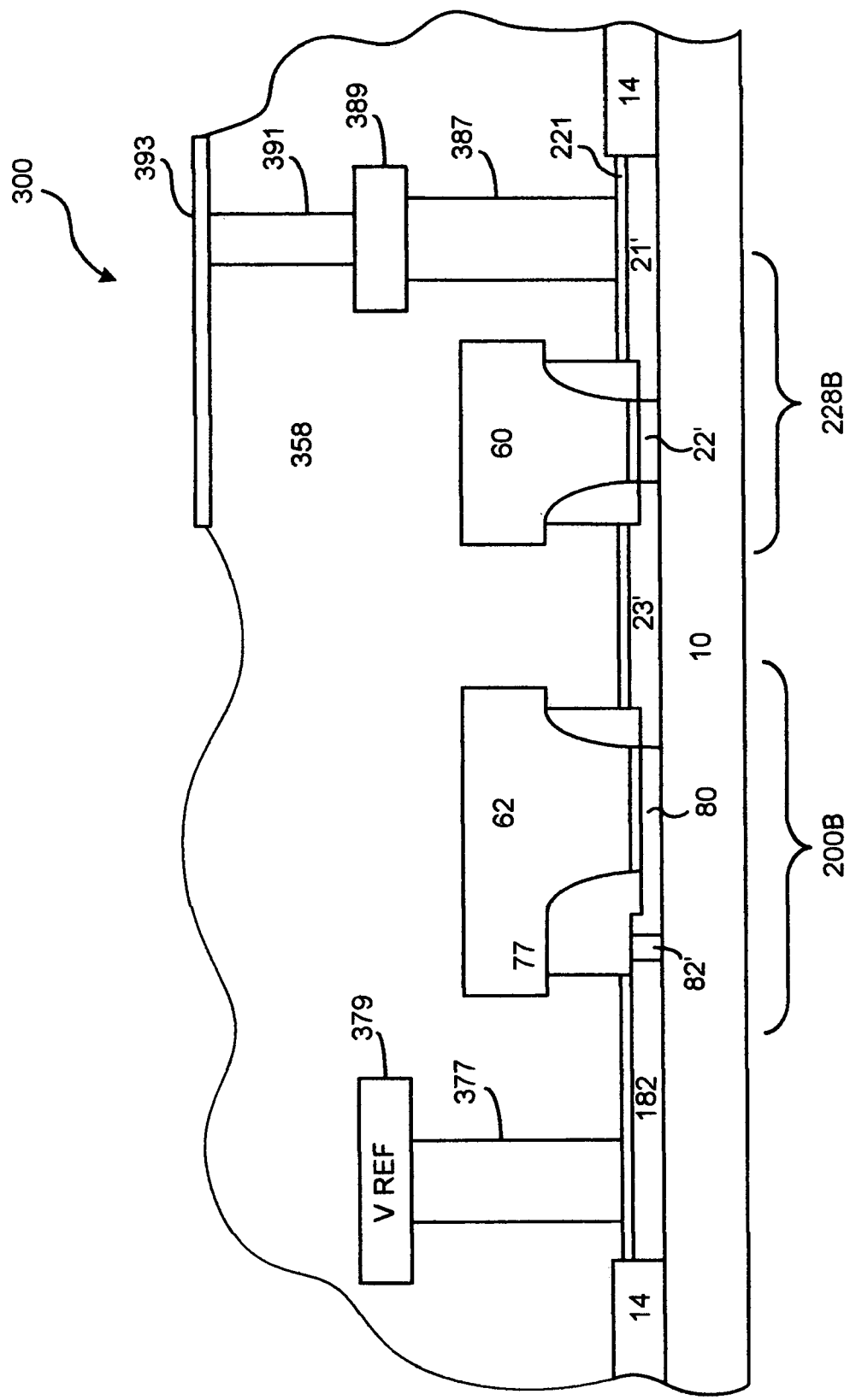
FIG. 12 is a cross-sectional view of a portion of the semiconductor device of FIGS. 2–11 in a further stage of fabrication useful to further describe a method of forming a thyristor memory, and showing formation of a bit contact to a bitline electrically coupled to a source/drain region of the access transistor and a reference contact to couple a reference voltage to an emitter region of a thyristor.

Referencing FIG. 12, known metal interconnects, for example, may be formed to interconnect voltage reference metallization 379 via a reference interconnect 377 to the thyristors anode-emitter region 182 and to couple bitline 393 via bitline interconnects 391, 389, 387 to drain/source region 21 of access transistor 228. Dielectric 358, illustrated generally within FIG. 12, may be disposed about the various metal layers and metal interconnects. It is understood, however, that such dielectric material may comprise multiple layers of insulating dielectric as might be used during the formation of the different metal layers 389, 393. Such insulating material 358 in accordance with particular embodiments may comprise, for example, spin-on glass, borophosphosilicate glass (BPSG), tetraethylosilicate glass (TEOS), etc.

In further embodiments, thin-capacitively coupled thyristor (TCCT) semiconductor memory device 300 may comprise thyristor 200B with a capacitor electrode 62. The capacitor electrode 62 may comprise shoulder 77 that extends to a peripheral edge related to placement or definition of the N-base and an associated emitter interface. Bitline 393 may be disposed as an upper or middle layer metal layer. The metallization for the reference voltage may likewise be associated with another one of the layers. These first and second metal layers may be formed, in a particular embodiment, at planes that reside above the gate electrode 60 and capacitor electrode 62. Known metal via interconnects 391, 387, 377 may be formed for interconnecting the bitline and reference voltage metal layers to the separate layers of the integrated circuit and/or respective neighboring metal layers. Further illustrated in FIG. 12, the first and the second wordlines 60, 62 may run in parallel to each other and also in parallel relationship to the metallization line 379 for the reference voltage. The bitlines 393, on the other hand, may run in a direction perpendicular to the orientation of the first and second wordlines. In further alternative embodiments, these metallization orientations may be reversed or altered.

Figure 13:
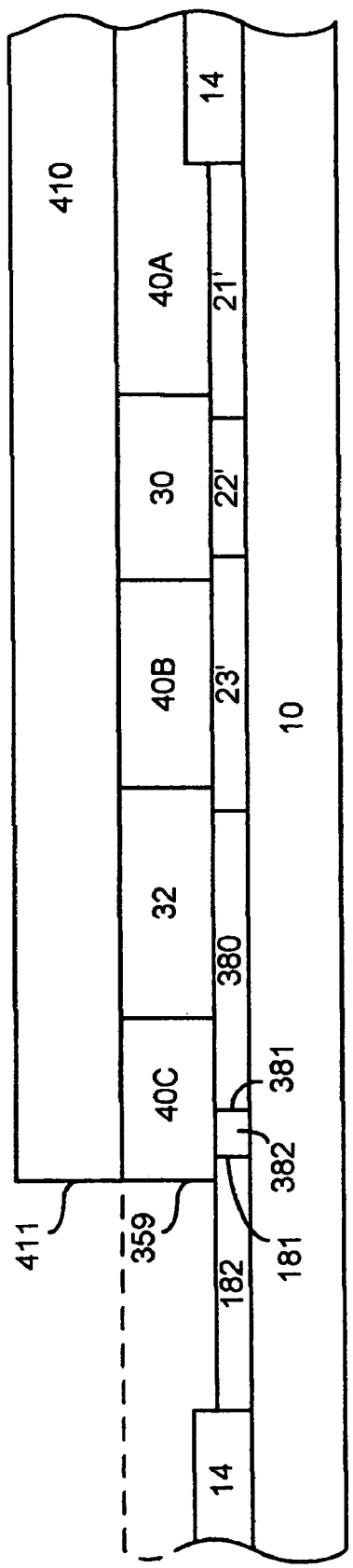
FIG. 13 is a cross-sectional view of a portion of a semiconductor device of FIGS. 2 and 3 in another stage of processing useful to describe a method of forming a thyristor memory in an embodiment of the present invention, and showing patterning of photoresist to define exposed regions of dielectric to be removed from over an emitter region for the thyristor.

In another embodiment of the present invention, with reference to FIG. 13 and in comparison to FIG. 3 as described earlier herein, after the layering and planarizing of the second sacrificial material 40, photoresist 410 may be disposed over the planarized first and second dielectrics. Photolithographic patterning may form sidewall 411 of photoresist 410 at a position appropriate for defining a lateral extent 359 to second sacrificial material 40C. The lateral extent may be offset from the first sacrificial material 32 by a distance appropriate for enabling inclusion or formation of the full width of N-base region 382 therebelow, and at the same time with an offset from the first sacrificial material 32 or pre-capacitor electrode. After patterning photoresist 410 and defining sidewall 411, an anisotropic etch may be employed for etching exposed regions of the second sacrificial material to form mask sidewall 359 for second sacrificial material 40C.

Depending upon the thickness of the second sacrificial material 40C, photoresist 410 may be removed before subsequent implanting and formation of base region 382. Alternatively, photoresist 410 may remain over the patterned second sacrificial material 40C during implants for definition of second base region 382.

After defining peripheral edge 359 for the second sacrificial material 40C, the resulting implant mask may be used during formation of second base region 382 and for establishing a lateral extent and placement of a N-P interface 381 relative to first base region 380. The implant for this second base region may employ procedures as described earlier herein relative to FIG. 9. After forming the lateral extent for the second base region, the implant for the anode-emitter 182 may be performed similarly as previously described relative to FIG. 10. The angles of incidence for the base implant and the emitter implant along with their implant energies and alignment to the peripheral edge 359 of the implant mask may each be controlled for establishing the width for second base region 382 between N-P interface 381 and N-P interface 181. Again, after forming these base and emitter regions 382, 182, a rapid thermal anneal may be employed for activating the doped regions within the thin layer of silicon of the SOI substrate. Processing may continue similarly as previously described relative to FIGS. 5–8 and 11–12 for completing formation of the gate and capacitor electrodes for the transistor and TCCT of the thyristor semiconductor memory device.

Figure 14:
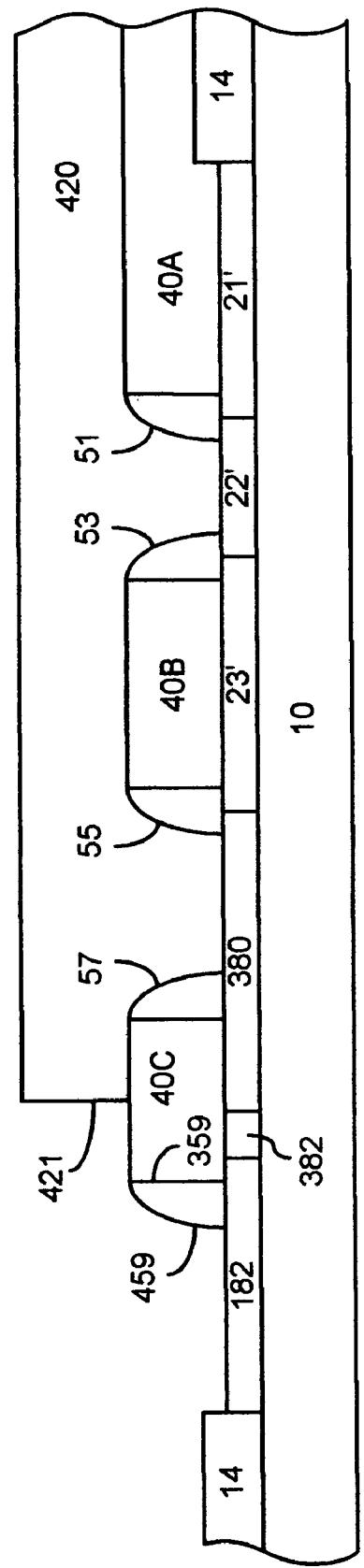
FIG. 14 is a cross-sectional view of a portion of a semiconductor device of FIGS. 2–3 and 13 in another stage of processing useful to describe a method of forming a thyristor memory, and showing further photoresist patterning after pre-gate and pre-capacitor electrode structures have been removed and after spacers have been formed against the sidewalls of the second sacrificial material.

In yet another embodiment of the present invention, with reference to FIG. 14, after anisotropically etching exposed regions of the second sacrificial material 40C (FIG. 13), the photoresist (410 FIG. 13) thereover may be removed and spacers 51, 53, 55, 57, 459 formed along the sidewalls of the previously patterned second sacrificial material structures 40A, 40B, 40C. In a particular embodiment, the spacers may be formed of nitride with a thickness about 70 nanometers.

Thereafter, additional photoresist 420 may be layered and patterned to define a sidewall 421 somewhere over the top of second sacrificial material 40C to be associated with the overhang. Accordingly, the newly patterned photoresist 420 may protect regions of the silicon layer to be associated with the access transistor and the capacitor electrode. Spacer 459, against sidewall 359 of second sacrificial material 40C, may be used to align the second base and emitter implants. These implants may be performed similarly as previously described by using two separate implant angles and/or energy to define a width of second base region 382 beneath the second sacrificial material 40C and/or spacer 459.

Referencing FIG. 15, after forming second base region 382 (FIGS. 13 14), gate and capacitor electrodes 60, 62 may be formed over gate and capacitor dielectrics 64, 66 and within respective first and second trenches as defined by the previously patterned second sacrificial material and spacers. Relative to FIG. 13, photoresist 410 may be removed and also regions 30, 32 of the first sacrificial material may also be removed. Spacers 51, 53, 55, 57 and 459 may then be formed in the openings and against sidewalls of the second sacrificial material 40A, 40B, 40C. After defining the spacers, then the gate electrode 60 and capacitor electrode 62 may be formed over gate and capacitor dielectric 64, 66 similarly as previously described relative to FIG. 6. In comparison to the structure of FIG. 7, this embodiment may form a capacitor electrode with second shoulder 77 of the gate electrode 62 overlying dielectric 40C such that its sidewall 467, 67 may not be vertically aligned directly and relative to the lateral edge of mask 459 therebelow (FIG. 16). During the formation of the first based region 382 and emitter region 182, the lateral extent 459 of the mask, while not necessarily aligned directly with respect to the capacitor electrodes' sidewall 67, may be related thereto.

In this embodiment, the lateral edge of the mask 459 may comprise a placement appropriate for positioning second base region 382 therebelow and in a relationship to the lateral edge 67 of the second shoulder 77 of capacitor electrode 62. Accordingly, a portion of the silicon layer the second base region may be offset laterally from the bottom of the capacitor electrode 62 to avoid the GIDL effects therefrom and preserve semiconductor real estate during its overall fabrication. Additionally, the flaring shoulders of the capacitor electrode may lower its resistivity, may accommodate wider manufacturing tolerances photolithographic procedures for definition of the gate and capacitor electrodes, and may provide greater surface areas thereof for silicide formation.

In forming the gate and capacitor electrodes, further referencing FIGS. 15–16, dielectric may be formed over the exposed silicon regions to define the gate and capacitor dielectric materials 64, 66, 66B. In a particular embodiment, the dielectric may comprise thermal oxide. The thermal oxide 66B formed over the thyristor's emitter region 182 may subsequently be used as a etch stop layer during patterning of the conductive material. After layering conductive material 429, planarization may level its upper surface. Photoresist may then be formed and patterned thereover to define mask regions 460, 462 with sidewalls 461, 463 about photoresist 460 for definition of a gate electrode region, and sidewalls 465, 467 about portion 462 for defining capacitor electrode regions. An anisotropic etch for etch exposed regions of the conductive material 429 while using patterned photoresist 460, 462 as an etchant mask. The anisotropic etch may etch the conductive layer 429 more favorably relative to the dielectric of, for example, (i) oxide of the second sacrificial material 40C, (ii) nitride of the nitride spacer against a sidewall of the second sacrificial material 40C, (iii) oxide of the thermal oxide layer 60B as an etch stop and (iv) oxide of the isolation trench 14. Similarly, the etch may remove conductive material between sidewalls 463 and 465 of patterned photoresist 460 and 462 respectively until reaching oxide of second sacrificial material 40B. The anisotropic etch may be stopped after exposing the upper surface of the etch stop, thermal oxide 66B, over the thyristor's emitter region. Following the anisotropic etch, a quick oxide etch may then be used to remove the thermal oxide 66B from over emitter region 182. Fabrication may then continue similarly as previously described relative to FIGS. 8–12 for completing formation of the thin-capacitively coupled thyristor semiconductor memory device.

Figure 17:
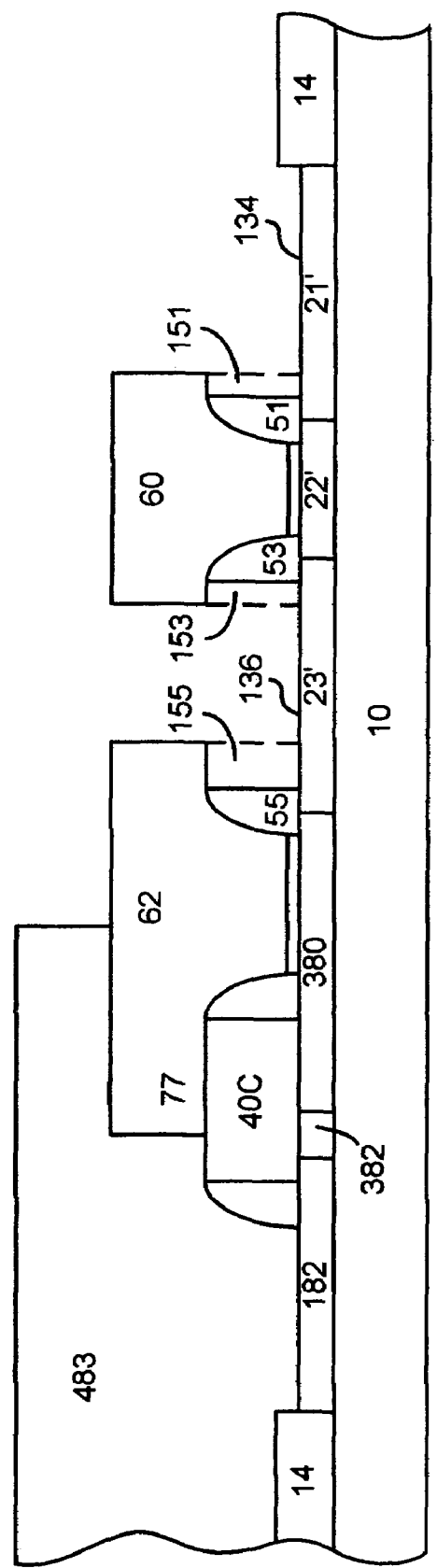
FIG. 17 is a cross-sectional view of a portion of a semiconductor device of FIG. 16 in a further stage of processing useful to describe fabrication of a thyristor memory, and showing patterned gate and capacitor electrodes in addition to patterned photoresist for protecting certain regions of the thyristor during removal of dielectric between the gate and capacitor electrodes.

In one such completion process, for example, further referencing FIG. 17, photoresist may be layered and patterned for protecting emitter regions 182 of the thyristor and a portion of the second shoulder 77 of capacitor electrode 62. The wider width across the top of capacitor electrode 62 may allow for low-resolution photolithographic patterning during definition of photoresist mask 483. While protecting the emitter regions 182 of the thyristor, an etching may be used for removing portions of the second sacrificial material 40B and 40A (referencing FIG. 15) for exposing surface regions 134, 136 of silicon over source/drain and drain/source regions 21, 23 respectively. During this dielectric removal, an isotropic etch may form remaining portions thereof 151, 153, 155 beneath respective shoulders of the gate electrode and capacitor electrode.

In another embodiment, referencing FIGS. 15–17, definition of the gate and capacitor electrodes may employ an etch selective to removing the conductive material more favorably relative to thermal oxide 66B, which may be used as the etch stop layer. Photoresist 483 might thus be formed over the semiconductor substrate to protect regions over the thermal oxide 66B over the anode/cathode-emitter 182. Anisotropic etching of the exposed oxide regions 40B and 40A over the source/drain regions may then be performed for exposing the surfaces 134, 136 of the silicon layer. Thereafter, photoresist 483 might then be removed and a brief isotropic etch performed for removing the remaining portions of oxide 151, 153, 155 beneath the shoulders of the gate electrode, which may also remove the thermal oxide 66B from over emitter region 182. Such isotropic etch would employ an etchant selective for removing oxide more favorably relative to silicon of the silicon layer. Further, the etchant would be more favorable to etching oxide relative to nitride spacers 51, 53, 55. During such oxide etch; a portion of the oxide proximate the second shoulder 77 of the capacitor electrode may be removed so as to define a notch therein. Of nominal depth, such notch may be deemed harmless. In particular embodiments, the thickness of the second sacrificial material 40C may be greater than the amount of oxide associated with remaining portions 151, 153, 155 to be removed from beneath the respective gate electrode and capacitor electrode shoulders. After removing the remaining portions of oxide, further fabrication procedures may continue similarly as previously described relative to FIGS. 8–12.

Figure 18:
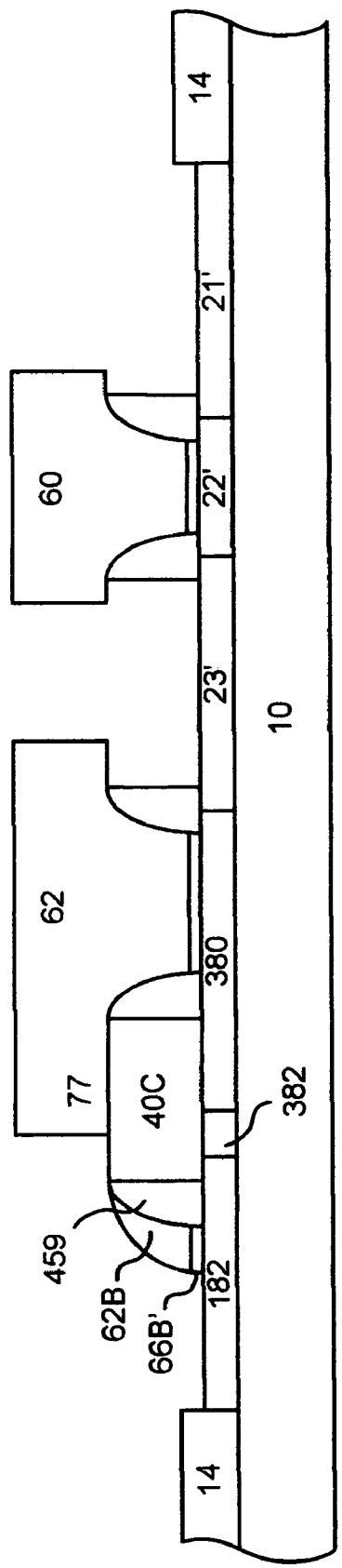
FIG. 18 is a cross-sectional view of a portion of the semiconductor device of FIG. 17 in another stage of fabrication, and showing a potential stringer artifact that may be associated with a particular method of forming a thyristor memory.

Moving forward with reference to FIG. 18, the previously described embodiment may form stringers of residual spurious portions of conductive material 62B over thermal oxide 66B' against the sidewall of spacer 459. This is disclosed simply as a possible derivative of this particular embodiment. The stringer 62B may be left floating or isolated from a reference voltage interconnect (377 FIG. 12) or alternatively could be shorted to such metal interconnect associated with interconnecting the emitter region of the thyristor to reference voltage conductive line 379. An offset may be provided over the top of the second sacrificial material 40C between the lateral edge of shoulder 77 of to the capacitor electrode and the lateral edge of the second sacrificial material 40C to prevent such shorting. A sufficient offset may assure that the conductive material may be cleanly stripped during anisotropic etching to avoid any conductive interconnects between the conductive material for the capacitor electrode 62 and the possible stringer 62B.

Figure 19:
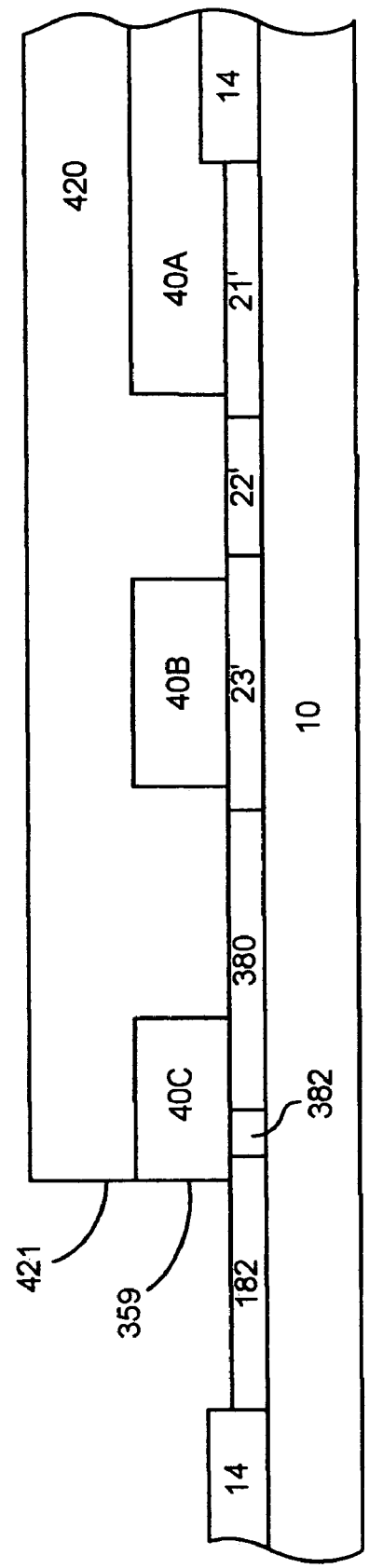
FIG. 19 is a cross-sectional view of a portion of a semiconductor device during a method of forming a thyristor memory according to another embodiment of the present invention, and showing patterning of photoresist over second sacrificial material before the formation of spacers against sidewalls of the second sacrificial material.

In a further embodiment of the present invention, referencing FIG. 19 and in comparison to the previously described embodiment of FIG. 13, the first sacrificial material or the pre-gate and pre-capacitor structures 30, 32 may be removed before the layering of the photoresist 420. After patterning of the photoresist for defining sidewall 421, lateral edge 359 for the second sacrificial material section 40C may be formed for assisting alignment of the N-base and anode-emitter implants. Following the definition of the N-base and anode-emitter, the photoresist may then be stripped and a rapid thermal anneal used to activate the implant regions. Again, remaining steps for the fabrication of the TCCT memory device may continue similarly as previously described relative to FIGS. 5–12.

Figure 20:
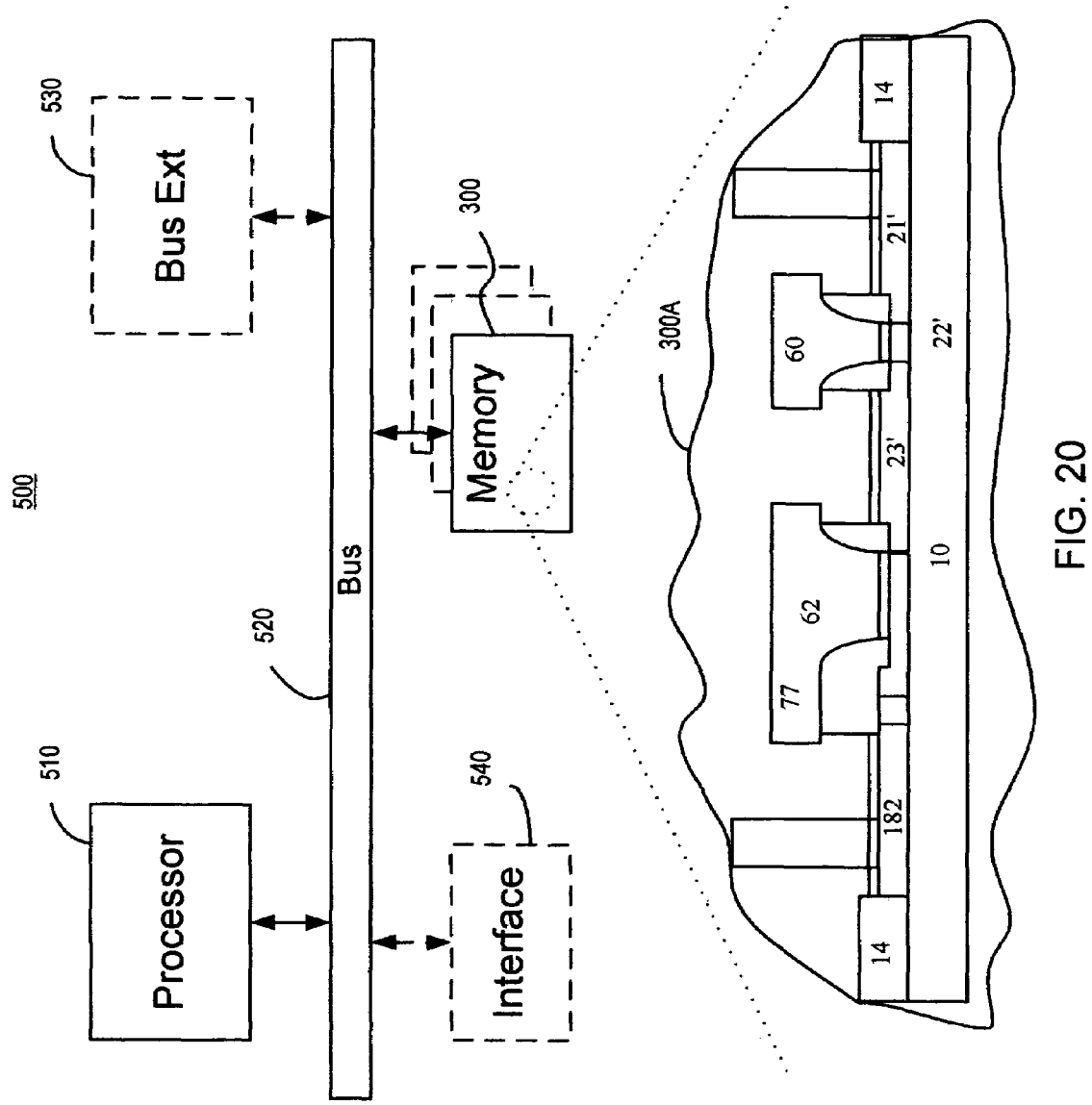
FIG. 20 is a simplified block diagram of an electronic system in accordance with an embodiment of the present invention, and showing an integration of thyristor-based semiconductor memory.

Referencing FIG. 20, an electronic system 500 may comprise one or more memory modules 300 containing at least one instance of the inventive thin capacitively coupled thyristor semiconductor memory 300A as described previously herein. It may also include sub-combinations of such previously described structures. In accordance with a further embodiment, the electronic system 500 may also comprise processor 510 in communication with the memory module(s) via bus 520. These elements may be collectively referenced as a computer system per one example of the electronic system.

The system 500 may further include an interface circuit 540 such as an input/output (I/O) device that may be coupled to processor 510 and/or memory modules 300 via bus 520. In particular embodiments, the interface 540 may comprise one or more of an interface to a monitor, a printer, a bulk storage device, a keyboard and a pointing device, etc. The system may also comprise bus extension circuitry 530 supporting known bus interface exchange protocols, such as, parallel-to-USB and/or others. Bus extension circuitry 530 may comprise a network interface, or other network exchange communication circuit, etc.

In further embodiments, processor 510 may include embedded memory. Additionally, memory module(s) 300, interface circuit 540 and bus extension circuitry 530 of computer system 260 can be incorporated on a single integrated circuit, i.e., system on a chip. These single packaged units may be able to reduce the communication time between processor 510 and memory system 300.

In further optional embodiments, the interface 540 may comprise one or more of: routers, computer servers, graphics processors, graphics modules, cellular components; an automobile user devices and/or controllers; and a card reader, keypad, panel and dispenser of an automated teller machine. User interface 540 may further be operable to specify access ports to the electronic system 500. Access ports may be used to connect the electronic system to the more tangible user interface components as previously exemplified.

TCCT based memory may also be embedded as part of a larger function. For example, microprocessors, microcontrollers, graphic accelerators, all use significant amounts of memory embedded inside the chip. These memories' can be made with TCCT based memory cells.

It may be understood from the lists of examples above, system 500 may contain certain mechanical components (not shown) in addition to circuit modules 510,520,530,540, 300. Additionally, one or more of these circuit modules in system 500 may be replaced by a single integrated circuit, which may be references as a system on a chip. Furthermore, system 500 may be a sub-component to a larger electronic system.

In a further embodiment of an electronic system, the memory module(s) 300, of embodiments as described above, may interface with a memory controller that may include logic contained in an embedded processor. Such memory may control a bidirectional interface between the memory 300 and an external system bus.

In an implementation not shown the spacers are put around the first sacrificial material 30, 32 instead of the second 40.

While certain exemplary features of the embodiments of the invention have been illustrated and described above, many modifications, substitutions, changes and equivalents may be available to those skilled in the art. It is, therefore, to be understood that the appended claims are intended to cover all such embodiments and changes as fall within the spirit of this invention.

Referencing FIG. 5B, after forming the spacers against the sidewalls of the second sacrificial dielectric and defining the openings (50, 51 of FIG. 5A), a thin layer of dielectric 164 may be formed. In a particular embodiment, the dielectric may comprise a high-k dielectric as known in the art of semiconductor capacitor fabrication. The high-k dielectric may be deposited (e.g., by known chemical vapor deposition CVD procedure) to form a thin conformal layer—e.g., 20–100 angstroms—over exposed regions (49, 48 of FIG. 5A) of the layer of silicon and over the spacers (51, 53, 55, 57) and second sacrificial dielectric 40.

In another embodiment, referencing FIG. 5C, before layering the high-k dielectric over the substrate, first dielectric 264, 266 may be formed over the exposed regions of silicon. The first dielectric may act as a barrier between materials of the high-k dielectric and the layer of silicon 20. In a particular embodiment, known thermal oxidation processes may be used to form the first dielectric. In an area for a MOSFET, the dielectric may be referenced as a gate oxide/dielectric and may be used to space a gate electrode for the MOSFET over channel region 22' in the layer of silicon. In an area for a thyristor, the dielectric may be referenced as a capacitor dielectric and may serve to separate a capacitor electrode from a first base region for the thyristor. When using the high-k dielectric material for the capacitor dielectric, first dielectric 266 beneath the high-k dielectric may be described as a pedestal or barrier layer.

In other embodiments not shown the thickness of the dielectric material coupling the gate electrode to a base region and the dielectric material couple the pass FET to a channel region may be different. The dielectric material coupling the gate electrode to a base region can be thicker that the dielectric material associated with the pass FET, i.e., between the gate electrode and its channel region.

In another embodiment (not shown) the top of the conductive gate material is removed using a planarization technique such as CMP. This causes some cosmetic changes to the cell.

In a further embodiment, after forming the conformal layer of high-k dielectric, an anneal may be performed to fill pinholes of the high-k dielectric and improve an overall integrity of the gate and capacitor dielectrics.

What is claimed is:

1. A semiconductor device comprising:
   a thyristor having first and second base regions disposed serially between first and second emitter regions;
   a capacitor electrode comprising a surface disposed over at least one of the first and second base regions;
   dielectric of first thickness disposed between the surface of the capacitor electrode and the first base region;
   dielectric of second thickness disposed between the second base region and the surface of the capacitor electrode, the dielectric of second thickness substantially thicker than that of the first thickness;
   a foot disposed in spaced relationship over at least a portion of the first base region of the thyristor and separated therefrom by the dielectric of first thickness,
   a body extending upwardly from the foot, and
   at least one arm extending laterally outward from the body,
   one of the arm(s) over a portion of the second base and spaced therefrom, at least in part, by the dielectric of the second thickness.

2. The device of claim 1, the emitter and base regions of the thyristor formed in a layer of silicon of an SOI substrate.

3. The device of claim 1, in which the dielectric of first thickness comprises:
   a barrier layer; and
   a high-K dielectric conformal to the barrier layer.

4. The device of claim 3, in which the barrier layer comprises a thermal oxide of thickness less than 5 nm.

5. The device of claim 4, in which the high-k dielectric comprises a dielectric constant greater than that of the oxide.

6. The device of claim 5, in which the high-k dielectric defines a conformal layer of thickness less than 5 nm over the barrier layer.

7. The device of claim 1, the dielectric of second thickness comprising a thickness that is at least twice that of the dielectric of the first thickness.

8. The device of claim 7, a portion of the dielectric of the second thickness also between a portion of the first base region and the surface of the capacitor electrode.

9. The device of claim 7, the dielectric of first thickness comprising a thickness less than 20 nm, and the dielectric of second thickness comprising a thickness greater than 50 nm.

10. The device of claim 1, further comprising:
    a transistor comprising source and drain regions separated by a channel region, and a gate electrode to control a conductivity of the channel region; and
    one of the source and drain regions of the MOSFET in common with one of the first and second emitter regions of the thyristor.

11. The device of claim 10, the capacitor electrode that is coupled to the thyristor and the gate electrode of the transistor each formed by a replacement gate process.

* * * * *